US007965021B2

(12) United States Patent
Harigai et al.

(10) Patent No.: US 7,965,021 B2
(45) Date of Patent: Jun. 21, 2011

(54) PIEZOELECTRIC THIN FILM AND METHOD OF MANUFACTURING THE SAME, INK JET HEAD, METHOD OF FORMING IMAGE WITH THE INK JET HEAD, ANGULAR VELOCITY SENSOR, METHOD OF MEASURING ANGULAR VELOCITY WITH THE ANGULAR VELOCITY SENSOR, PIEZOELECTRIC GENERATING ELEMENT, AND METHOD OF GENERATING ELECTRIC POWER WITH THE PIEZOELECTRIC GENERATING ELEMENT

(75) Inventors: Takakiyo Harigai, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/844,582

(22) Filed: Jul. 27, 2010

(65) Prior Publication Data
US 2010/0289383 A1    Nov. 18, 2010

Related U.S. Application Data

(63) Continuation of application No. PCT/JP2010/000148, filed on Jan. 13, 2010.

(30) Foreign Application Priority Data

Jan. 20, 2009  (JP) ................................. 2009-009495

(51) Int. Cl.
H01L 41/187    (2006.01)
(52) U.S. Cl. ......................... 310/358; 310/363; 310/370

(58) Field of Classification Search .................. 310/358, 310/363, 364, 370
See application file for complete search history.

(56) References Cited

U.S. PATENT DOCUMENTS
6,162,293 A     12/2000  Kijima et al.
7,291,960 B2 *  11/2007  Iwashita et al. ............... 310/363
2002/0014196 A1  2/2002  Takase et al.
(Continued)

FOREIGN PATENT DOCUMENTS
JP          4-60073           9/1992
(Continued)

OTHER PUBLICATIONS

Tadashi Takenaka et al., "$(Bi_{1/2}Na_{1/2})TiO_3$-$BaTiO_3$ System for Lead-Free Piezoelectric Ceramics," Japanese Journal of Applied Physics, vol. 30, No. 9B, pp. 2236-2239, Sep. 1991.
(Continued)

Primary Examiner — Derek J Rosenau
(74) Attorney, Agent, or Firm — McDermott Will & Emery LLP

(57) ABSTRACT

Provided are a piezoelectric thin film including a lead-free ferroelectric material and exhibiting high piezoelectric performance comparable to that of lead zirconate titanate (PZT), and a method of manufacturing the piezoelectric thin film. The piezoelectric thin film of the present invention includes: a $LaNiO_3$ film having a (001) orientation; an interface layer having a (001) orientation and composed of a compound represented by a chemical formula $ABO_3$ (where A is represented by $(Bi,Na)_{1-x}C_x$ ($0 \leq x \leq 1$), B is Ti or TiZr, and C is an alkali metal other than Na); and a $(Bi,Na,Ba)TiO_3$ film having a (001) orientation. The $LaNiO_3$ film, the interface layer, and the $(Bi,Na,Ba)TiO_3$ film are laminated in this order.

36 Claims, 22 Drawing Sheets

U.S. PATENT DOCUMENTS

| | | |
|---|---|---|
| 2004/0166357 A1 | 8/2004 | Sakashita |
| 2008/0218559 A1* | 9/2008 | Fujii et al. ............... 347/68 |
| 2010/0013894 A1* | 1/2010 | Ueno et al. ............... 347/72 |

FOREIGN PATENT DOCUMENTS

| | | |
|---|---|---|
| JP | 10-182291 | 7/1998 |
| JP | 11-180769 | 7/1999 |
| JP | 2001-048642 | 2/2001 |
| JP | 2001-294482 | 10/2001 |
| JP | 2007-266346 | 10/2007 |
| WO | WO 2004/077562 A1 | 9/2004 |

OTHER PUBLICATIONS

Hong-Wei Cheng et al., "Combinatorial studies of $(1-x)Na_{0.5}Bi_{0.5}TiO_3$ thin-film chips," Applied Physics Letters, vol. 85, No. 12, pp. 2319-2321, Sep. 20, 2004.

Shinichi Miyake et al., "(100)-Orientation of Pseudocubic Perovskite-Type $LaNiO_3$ Thin Films of Glass Substrates via the Sol-Gel Process," Communications of the American Ceramic Society, vol. 85, No. 4, pp. 992-994, 2002.

* cited by examiner

PIEZOELECTRIC THIN FILM AND METHOD OF MANUFACTURING THE SAME, INK JET HEAD, METHOD OF FORMING IMAGE WITH THE INK JET HEAD, ANGULAR VELOCITY SENSOR, METHOD OF MEASURING ANGULAR VELOCITY WITH THE ANGULAR VELOCITY SENSOR, PIEZOELECTRIC GENERATING ELEMENT, AND METHOD OF GENERATING ELECTRIC POWER WITH THE PIEZOELECTRIC GENERATING ELEMENT

CROSS-REFERENCE TO RELATED APPLICATIONS

This is a continuation of PCT International Application PCT/JP2010/000148 filed on Jan. 13, 2010, which claims priority of Japanese Patent Application No. 2009-009495, filed on Jan. 20, 2009. The disclosures of these applications including the specifications, the drawings, and the claims are hereby incorporated by reference in their entirety.

BACKGROUND OF THE INVENTION

1. Field of the Invention

The present invention relates to a piezoelectric thin film including a piezoelectric layer and a method of manufacturing the same. The present invention further relates to an ink jet head including the piezoelectric thin film and a method of forming an image with the head, to an angular velocity sensor including the piezoelectric thin film and a method of measuring an angular velocity with the sensor, and to a piezoelectric generating element including the piezoelectric thin film and a method of generating electric power with the element.

2. Description of Related Art

Lead zirconate titanate (PZT: $Pb(Zr_yTi_{1-y})O_3$, $0<y<1$) is a typical ferroelectric material capable of storing a large amount of electric charge, and used in capacitors and thin film memories. PZT has pyroelectricity and piezoelectricity based on the ferroelectricity thereof. PZT has high piezoelectric performance, and its mechanical quality factor Qm can be controlled easily by adjusting the composition or adding an element thereto. This allows PZT to be applied to sensors, actuators, ultrasonic motors, filter circuits, and oscillators.

PZT, however, contains a large amount of lead. In recent years, there has been a growing concern that lead leached from waste may cause serious damage to the ecosystem and the environment. Accordingly, there has been an international movement toward restricting the use of lead. For this reason, lead-free ferroelectric materials, unlike PZT, have been in demand.

One of the lead-free ferroelectric materials that are currently under development is, for example, a perovskite-type composite oxide $[(Bi_{0.5}Na_{0.5})_{1-z}Ba_z]TiO_3$ made of bismuth (Bi), sodium (Na), barium (Ba), and titanium (Ti). JP 4(1992)-60073 B and T. Takenaka et al., Japanese Journal of Applied Physics, Vol. 30, No. 9B, (1991), pp. 2236-2239 disclose that this ferroelectric material exhibits high piezoelectric performance of about 125 pC/N in terms of a piezoelectric constant $d_{33}$, when the content of barium z (=[Ba/(Bi+Na+Ba)]) is 5 to 10%. The piezoelectric performance of the ferroelectric material is, however, lower than that of PZT.

JP 2007-266346 A and H. W. Cheng et al., Applied Physics Letters, Vol. 85, (2004), pp. 2319-2321 disclose that a (Bi,Na,Ba)TiO$_3$ film that is oriented in a specific direction is fabricated. It is expected that the alignment of the polarization axes in the (Bi,Na,Ba)TiO$_3$ film with the orientation improves the ferroelectric properties of the film, such as remanent polarization and piezoelectric performance.

JP 10(1998)-182291 A discloses (particularly in paragraph 0020) that a substrate having a surface on which a buffer layer is formed can control the orientation of a $Bi_4Ti_3O_{12}$ ferroelectric film, although it does not refer to a (Bi,Na,Ba)TiO$_3$ film. This publication also discloses that the buffer layer preferably contains all or a part of the constituent elements of the ferroelectric film to be formed thereon.

SUMMARY OF THE INVENTION

It is an object of the present invention to provide a piezoelectric thin film including a non-lead-containing (that is, lead-free) ferroelectric material and having high piezoelectric performance comparable to that of PZT, and a method of manufacturing the piezoelectric thin film.

It is another object of the present invention to provide an ink jet head, an angular velocity sensor, and a piezoelectric generating element, each including the lead-free piezoelectric thin film. It is still another object of the present invention to provide a method of forming an image with this ink jet head, a method of measuring an angular velocity with this angular velocity sensor, and a method of generating electric power with this piezoelectric generating element.

The present inventors have discovered the following: (i) a LaNiO$_3$ film formed on a base layer has a (001) orientation, regardless of the crystalline state of the base layer; and (ii) the formation of an interface layer composed of a specific compound on the LaNiO$_3$ film, and the formation of a (Bi, Na, Ba)TiO$_3$ film as a piezoelectric layer further on the interface layer allow the resulting (Bi,Na,Ba)TiO$_3$ film to have high crystallinity, high (001) orientation, and high piezoelectric performance. The present inventors have completed the present invention based on these findings.

The piezoelectric thin film of the present invention includes: a LaNiO$_3$ film having a (001) orientation; an interface layer having a (001) orientation and composed of a compound represented by a chemical formula ABO$_3$ (where A is represented by $(Bi,Na)_{1-x}C_x$ ($0 \leq x < 1$), B is Ti or TiZr, and C is an alkali metal other than Na); and a (Bi,Na,Ba)TiO$_3$ film having a (001) orientation. In this piezoelectric thin film, the LaNiO$_3$ film, the interface layer, and the (Bi,Na,Ba)TiO$_3$ film are laminated in this order.

The method of the present invention for manufacturing a piezoelectric thin film includes the steps of forming a LaNiO$_3$ film having a (001) orientation by sputtering; forming an interface layer on the LaNiO$_3$ film by sputtering, the interface layer having a (001) orientation and being composed of a compound represented by a chemical formula ABO$_3$ (where A is represented by $(Bi,Na)_{1-x}C_x$ ($0 \leq x < 1$), B is Ti or TiZr, and C is an alkali metal other than Na); and forming a (Bi,Na,Ba)TiO$_3$ film having a (001) orientation on the interface layer by sputtering to obtain a piezoelectric thin film in which the LaNiO$_3$ film, the interface layer, and the (Bi,Na,Ba)TiO$_3$ film are laminated in this order.

The ink jet head of the present invention includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded. The vibration layer is bonded to the piezoelectric thin film so that the vibration layer is displaceable in its film thickness direction according to a deformation of the piezoelectric thin film produced by a piezoelectric effect. The vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is represented by (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order.

The method of the present invention for forming an image with an ink jet head includes: a step of preparing the ink jet head; and the following step A. In this method, the ink jet head includes: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded. The vibration layer is bonded to the piezoelectric thin film so that the vibration layer is displaceable in its film thickness direction according to a deformation of the piezoelectric thin film produced by a piezoelectric effect. The vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is represented by (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order. The above-mentioned step A is a step of applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

The angular velocity sensor of the present invention includes: a substrate having a vibration part; and a piezoelectric thin film bonded to the vibration part and having a piezoelectric layer sandwiched between a first electrode and a second electrode. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order. One of the first electrode and the second electrode selected therefrom is composed of an electrode group including a drive electrode for applying a driving voltage that oscillates the vibration part to the piezoelectric layer and a sense electrode for measuring a deformation of the vibration part caused by an angular velocity applied to the vibration part that is oscillating.

The method of the present invention for measuring an angular velocity with an angular velocity sensor includes: a step of preparing the angular velocity sensor; and the following steps B and C. In this method, the angular velocity sensor includes: a substrate having a vibration part; and a piezoelectric thin film bonded to the vibration part and having a piezoelectric layer sandwiched between a first electrode and a second electrode. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order. One of the first electrode and the second electrode selected therefrom is composed of an electrode group including a drive electrode and a sense electrode. The above-mentioned step B is a step of applying a driving voltage to the piezoelectric layer through the drive electrode and the other of the first electrode and the second electrode selected therefrom to oscillate the vibration part. The above-mentioned step C is a step of measuring, through the other electrode and the sense electrode, a deformation of the vibration part caused by an angular velocity applied to the vibration part that is oscillating, to obtain a value of the applied angular velocity.

The piezoelectric generating element of the present invention includes: a substrate having a vibration part; and a piezoelectric thin film bonded to the vibration part and having a piezoelectric layer sandwiched between a first electrode and a second electrode. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order.

The method of the present invention for generating electric power with a piezoelectric generating element includes: a step of preparing the piezoelectric generating element; and the following step D. In this method, the piezoelectric generating element includes: a substrate having a vibration part; and a piezoelectric thin film bonded to the vibration part and having a piezoelectric layer sandwiched between a first electrode and a second electrode. The first electrode includes a LaNiO$_3$ film having a (001) orientation. The piezoelectric layer is composed of a (Bi,Na,Ba)TiO$_3$ film having a (001) orientation. The first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leq x < 1$), B is Ti or TiZr, and C is an alkali metal other than Na). The LaNiO$_3$ film, the interface layer, the (Bi,Na,Ba)TiO$_3$ film, and the second electrode are laminated in this order. The above-mentioned step D is a step of vibrating the vibration part to obtain electric power through the first electrode and the second electrode.

The present invention provides a lead-free piezoelectric thin film exhibiting high piezoelectric performance comparable to that of PZT.

The present invention provides an ink jet head, an angular velocity sensor, and a piezoelectric generating element, each including the lead-free piezoelectric thin film, and a method of forming an image with the ink jet head, a method of measuring an angular velocity with the angular velocity sensor, and a method of generating electric power with the piezoelectric generating element. The ink jet head of the present invention has excellent ink ejection characteristics. The method of forming an image with the ink jet head has high image forming accuracy and high expressivity. The angular velocity sensor of the present invention has excellent sensitivity. The method of measuring an angular velocity with the angular velocity sensor has excellent angular velocity measurement sensitivity. The piezoelectric generating element of the present invention has excellent electric power generation characteristics. The method of generating electric power with the piezoelectric generating element has excellent electric power generation efficiency.

DETAILED DESCRIPTION OF THE INVENTION

Figure 1A:
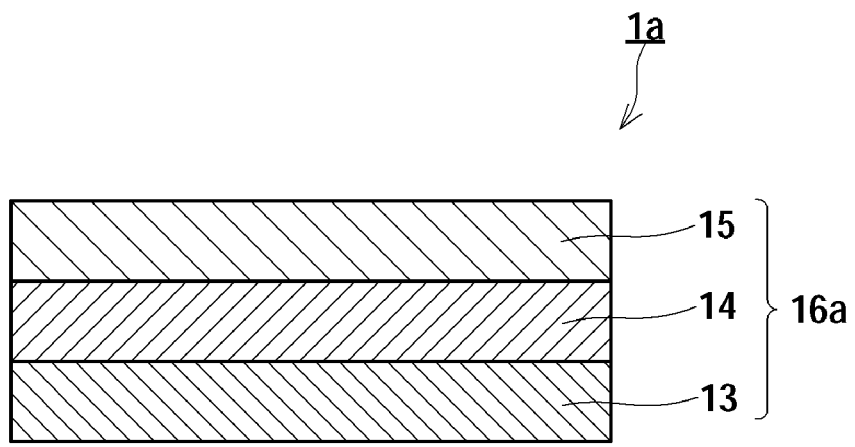
FIG. 1A is a cross-sectional view schematically showing an example of a piezoelectric thin film of the present invention.

Hereinafter, embodiments of the present invention will be described. In the following description, the same reference numerals are used to designate the same elements and parts, and therefore the overlapping description thereof can be omitted.

[Piezoelectric Thin Film and Method of Manufacturing Piezoelectric Thin Film]

FIG. 1A shows one embodiment of a piezoelectric thin film according to the present invention. A piezoelectric thin film 1a shown in FIG. 1A has a multilayer structure 16a. The multilayer structure 16a has a $LaNiO_3$ film 13 having a (001) orientation, an interface layer 14 having a (001) orientation, and a $(Bi,Na,Ba)TiO_3$ film 15 having a (001) orientation, in this order. These layer and films 13 to 15 are laminated in contact with each other. The interface layer 14 is composed of a compound represented by a chemical formula $ABO_3$. "A" is $(Bi,Na)_{1-x}C_x$. "B" is Ti or TiZr. "C" is an alkali metal other than Na. That is, C is at least one selected from Li, K, Rb, and Cs. "O" is oxygen. "x" is a numerical value satisfying a formula ($0 \leq x < 1$). The $(Bi,Na,Ba)TiO_3$ film 15 that is a piezoelectric layer has high crystallinity and high (001) orientation. This allows the piezoelectric thin film 1a to have high piezoelectric performance comparable to that of PZT, although it contains no lead.

The $LaNiO_3$ film 13 has a plane orientation of (001) on its surface. Typically, the $LaNiO_3$ film 13 can be formed by sputtering. The $LaNiO_3$ film 13 can be formed by other thin film formation techniques as long as it has a (001) orientation. Examples of the techniques include pulsed laser deposition (PLD), chemical vapor deposition (CVD), sol-gel processing, and aerosol deposition (AD).

In the piezoelectric thin film manufacturing method of the present invention, sputtering is used to form the $LaNiO_3$ film 13 having a (001) orientation.

The interface layer 14 is a layer having a (001) orientation and composed of a compound represented by a chemical formula $ABO_3$. That is, the interface layer 14 has a plane orientation of (001) on its surface. The interface layer 14 is sandwiched between the $LaNiO_3$ film 13 and the $(Bi,Na,Ba)TiO_3$ film 15. The interface layer 14 is necessary to form the $(Bi,Na,Ba)TiO_3$ film 15 having high crystallinity and high (001) orientation.

It is difficult to estimate the composition of the interface layer for forming a piezoelectric layer having high crystallinity and high orientation, based on the similarity of the lattice constants or the compositions of these piezoelectric layer and interface layer. In other words, a piezoelectric layer having high crystallinity and high orientation cannot always be obtained simply by providing an interface layer having a lattice constant or a composition similar to that of the piezoelectric layer. This is because it is generally difficult to form a multicomponent composite oxide having high crystallinity and high orientation, like (Bi, Na, Ba)$TiO_3$, due to a difference in the vapor pressure of each constituent element (except for oxygen) of the oxide. The present inventors have discovered that the $(Bi,Na,Ba)TiO_3$ film 15 provided on the interface layer 14 has high crystallinity and high orientation.

The thickness of the interface layer 14 is not limited. The thickness of at least several lattice units (about 2 nm) is large enough to obtain the $(Bi,Na,Ba)TiO_3$ film 15 having high crystallinity and high (001) orientation.

The interface layer 14 is composed of a compound represented by a chemical formula $ABO_3$. "A" is $(Bi,Na)_{1-x}C_x$. "B" is Ti or TiZr. "C" is an alkali metal other than Na. "x" is a numerical value satisfying a formula $0 \leq x < 1$.

The compound represented by the chemical formula $ABO_3$ has a perovskite-type crystal structure. The A site and B site in the perovskite structure have average valences of 2 and 4, respectively, depending on the placement of a single element or a plurality of elements. The site A contains Bi as a trivalent element and Na as a monovalent element so that it has an average valence of 2. Part of Na can be substituted by an alkali metal element C other than Na (C is at least one selected from Li, K, Rb, and Cs, and typically it is at least one selected from Li and K). The site B contains Ti as a quadrivalent element. Part of Ti can be substituted by Zr. Preferably x is 0, and preferably B is Ti. More preferably, x is equal to 0 and further B is Ti. That is, the compound represented by the chemical formula $ABO_3$ is preferably $(Bi,Na)TiO_3$, and the interface layer 14 is preferably composed of $(Bi,Na)TiO_3$.

The interface layer 14 may contain a minute amount of impurities. The impurities are, for example, Mn, Fe, Nb, and Ta. Some of the impurities can improve the crystallinity of the interface layer 14.

A (001)-oriented layer further may be sandwiched between the $LaNiO_3$ film 13 and the interface layer 14. The (001)-oriented layer is, for example, a Pt film or a $SrRuO_3$ film.

Typically, the interface layer 14 can be formed by sputtering. The interface layer 14 can be formed by other thin film formation techniques as long as it has a (001) orientation. Examples of the techniques include PLD, CVD, sol-gel processing, and AD.

According to the piezoelectric thin film manufacturing method of the present invention, the $ABO_3$ interface layer 14 is formed on the $LaNiO_3$ film 13 by sputtering.

The $(Bi,Na,Ba)TiO_3$ film 15 is a film composed of $(Bi,Na,Ba)TiO_3$. The $(Bi,Na,Ba)TiO_3$ film 15 has a plane orientation of (001) on its surface.

The thickness of the $(Bi,Na,Ba)TiO_3$ film 15 is not limited. The thickness thereof is at least 0.5 µm but not more than 10 µm, for example. Although the piezoelectric layer composed of the $(Bi,Na,Ba)TiO_3$ film 15 is such a thin film, it has high piezoelectric performance, and therefore the piezoelectric thin film of the present invention has sufficient practical utility.

The $(Bi,Na,Ba)TiO_3$ film 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The $(Bi,Na,Ba)TiO_3$ film 15 may contain a minute amount of impurities. The impurities typically are Li and K to substitute for Na, and Sr and Ca to substitute for Ba, in the A site. The impurity typically is Zr to substitute for Ti in the B site. Examples of the other impurities include Mn, Fe, Nb, and Ta. Some of these impurities can improve the crystallinity and piezoelectric performance of the $(Bi,Na,Ba)TiO_3$ film 15.

The method of forming the $(Bi,Na,Ba)TiO_3$ film 15 is not limited. Well-known thin film formation techniques, such as sputtering, PLD, CVD, sol-gel processing, and AD, can be employed.

According to the piezoelectric thin film manufacturing method of the present invention, the $(Bi,Na,Ba)TiO_3$ film 15 is formed on the interface layer 14 by sputtering.

Figure 1B:
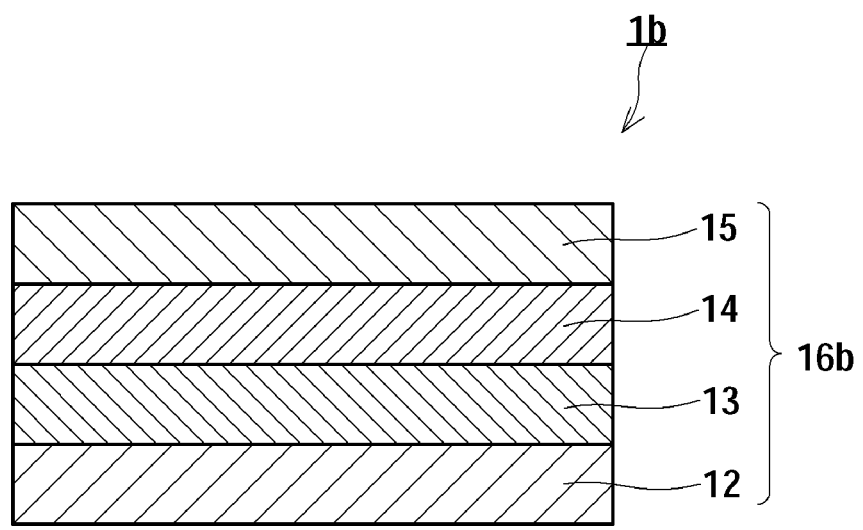
FIG. 1B is a cross-sectional view schematically showing another example of the piezoelectric thin film of the present invention.

FIG. 1B shows another embodiment of the piezoelectric thin film according to the present invention. A piezoelectric thin film 1b shown in FIG. 1B has a multilayer structure 16b. The multilayer structure 16b is a structure in which the multilayer structure 16a shown in FIG. 1A further includes a metal electrode film 12. In the multilayer structure 16b, the $LaNiO_3$ film 13 is formed on this metal electrode film 12. Specifically, the multilayer structure 16b has the metal electrode film 12, the $LaNiO_3$ film 13 having a (001) orientation, the interface layer 14 having a (001) orientation, and the $(Bi,Na,Ba)TiO_3$ film 15 having a (001) orientation, in this order. These layer and films 12 to 15 are laminated in contact with each other. The $(Bi,Na,Ba)TiO_3$ film 15 that is a piezoelectric layer has high crystallinity and high (001) orientation. This allows the piezoelectric thin film 1b to have high piezoelectric performance comparable to that of PZT, although it contains no lead.

The material for the metal electrode film 12 is not limited. More specifically, examples of the material for the metal electrode film 12 include metals such as platinum (Pt), palladium (Pd), gold (Au); and oxide semiconductors such as nickel oxide (NiO), ruthenium oxide ($RuO_2$), iridium oxide ($IrO_2$), and strontium ruthenate ($SrRuO_3$). The metal electrode film 12 can be composed of two or more of these materials. Preferably, the metal electrode film 12 has a low electrical resistance and a high heat resistance. Therefore, the metal electrode film 12 is preferably made of Pt. The metal electrode film 12 can have a (111) orientation, for example.

The piezoelectric thin film 1b shown in FIG. 1B can be manufactured by forming the $LaNiO_3$ film 13 on the metal electrode film 12, forming the interface layer 14 on the formed $LaNiO_3$ film 13, and forming the $(Bi,Na,Ba)TiO_3$ film 15 on the formed interface layer 14.

According to the piezoelectric thin film manufacturing method of the present invention, the $LaNiO_3$ film 13 may be formed on the metal electrode film 12. In this case, the metal electrode film 12 is preferably made of Pt.

The piezoelectric thin film of the present invention further may include a substrate so that the $LaNiO_3$ film is formed on that substrate. Such embodiments are shown in FIG. 1C and FIG. 1D.

Figure 1C:
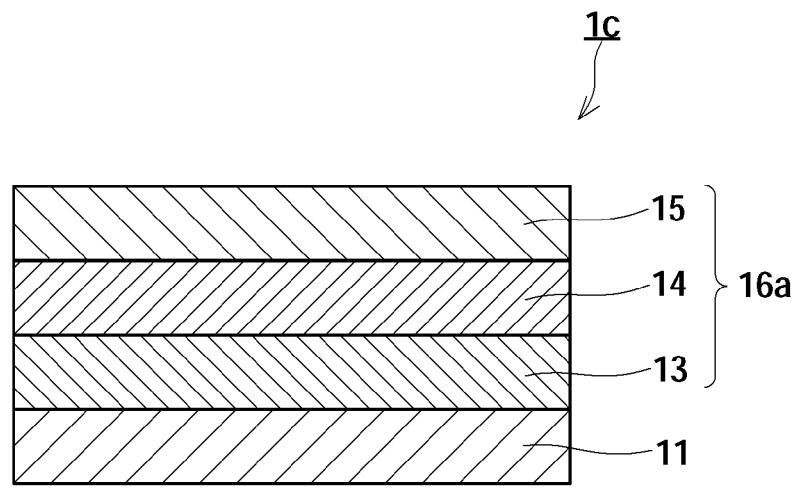
FIG. 1C is a cross-sectional view schematically showing still another example of the piezoelectric thin film of the present invention.
Figure 1D:
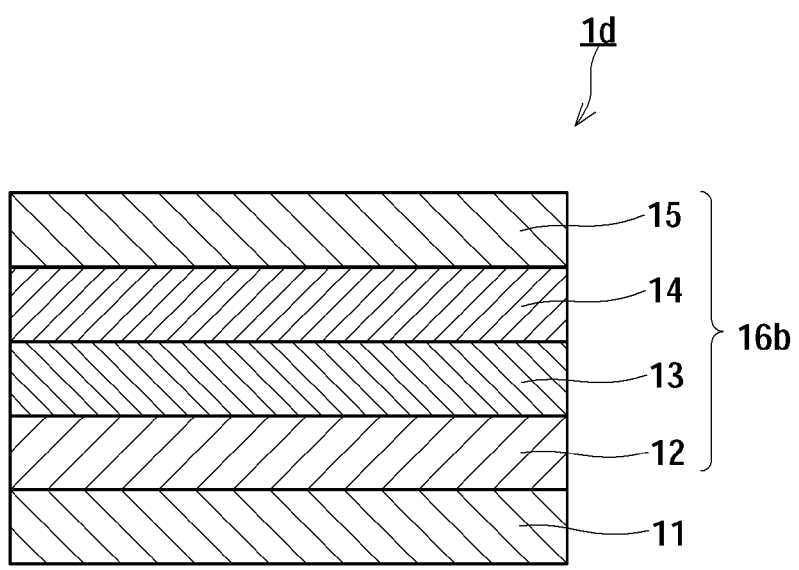
FIG. 1D is a cross-sectional view schematically showing further still another example of the piezoelectric thin film of the present invention.

A piezoelectric thin film 1c shown in FIG. 1C has a structure in which the multilayer structure 16a shown in FIG. 1A is formed on a substrate 11. A piezoelectric thin film 1d shown in FIG. 1D has a structure in which the multilayer structure 16b shown in FIG. 1B is formed on the substrate 11. In the piezoelectric thin films 1c and 1d, the $(Bi,Na,Ba)TiO_3$ film 15 that is a piezoelectric layer has high crystallinity and high (001) orientation, as described above. This allows the piezoelectric thin films 1c and 1d to have high piezoelectric performance comparable to that of PZT, although they contain no lead.

The substrate 11 can be a silicon (Si) substrate. Preferably, the substrate 11 is a monocrystalline Si substrate.

In each of the piezoelectric thin films 1c and 1d, an adhesive layer for improving the adhesion between the substrate 11 and the multilayer structure 16a and between the substrate 11 and the multilayer structure 16b (more specifically, between the substrate 11 and the $LaNiO_3$ film 13 in the piezoelectric thin film 1c, and between the substrate 11 and the metal electrode film 12 in the piezoelectric thin film 1d) can be disposed therebetween, if necessary. Examples of the material for the adhesive layer include at least one selected from titanium (Ti), tantalum (Ta), iron (Fe), cobalt (Co), nickel (Ni), and chromium (Cr), or a compound of these materials.

The piezoelectric thin film 1c shown in FIG. 1C can be manufactured by forming the $LaNiO_3$ film 13 on the substrate 11, forming the interface layer 14 on the formed $LaNiO_3$ film 13, and forming the $(Bi,Na,Ba)TiO_3$ film 15 on the formed interface layer 14.

The piezoelectric thin film 1d shown in FIG. 1D can be manufactured by forming the metal electrode film 12 on the substrate 11, forming the $LaNiO_3$ film 13 on the formed metal electrode film 12, forming the interface layer 14 on the formed $LaNiO_3$ film 13, and forming the $(Bi,Na,Ba)TiO_3$ film 15 on the formed interface layer 14.

According to the piezoelectric thin film manufacturing method of the present invention, the $LaNiO_3$ film 13 may be formed on the substrate 11. In this case, the substrate 11 is preferably made of Si.

The piezoelectric thin films 1a to 1d shown in FIG. 1A to FIG. 1D can be manufactured using a base substrate. Specifically, after the multilayer structure 16a or 16b is formed on the base substrate, this base substrate can be used as the substrate 11. The base substrate can be removed by a well-known technique such as etching.

The base substrate can be one of the following substrates: a substrate made of an oxide having a NaCl structure, such as MgO; a substrate made of an oxide having a perovskite structure, such as $SrTiO_3$, $LaAlO_3$, and $NdGaO_3$; a substrate made of an oxide having a corundum structure, such as $Al_2O_3$; a substrate made of an oxide having a spinel structure, such as $MgAl_2O_4$; a substrate made of an oxide having a rutile structure, such as $TiO_2$; and a substrate made of an oxide having a cubic crystal structure, such as $(La,Sr)(Al,Ta)O_3$, and yttria-stabilized zirconia (YSZ). The base substrate can be formed by laminating an oxide thin film having a NaCl type crystal structure on the surface of a glass substrate, a ceramic substrate such as an alumina substrate, or a metal substrate such as a stainless steel substrate. In this case, the metal electrode film 12 or the $LaNiO_3$ film 13 can be formed on the surface of the oxide thin film. Examples of the oxide thin film include a MgO thin film, a NiO thin film, and a cobalt oxide (CoO) thin film.

The piezoelectric thin film of the present invention may have an arbitrary layer in addition to the substrate 11, the metal electrode film 12, the $LaNiO_3$ film 13, the interface layer 14, and the $(Bi,Na,Ba)TiO_3$ film 15, if necessary. Such a piezoelectric thin film can be formed, for example, by adding a step of forming the arbitrary layer to the manufacturing method of the present invention. The arbitrary layer is, for example, an electrode that sandwiches the interface layer 14 and the $(Bi,Na,Ba)TiO_3$ film 15 with the $LaNiO_3$ film 13 or with the $LaNiO_3$ film 13 and the metal electrode film 12 therebetween. This electrode can, for example, be composed of a conductive material such as a metal or a conductive oxide.

According to the piezoelectric thin film manufacturing method of the present invention, the $LaNiO_3$ film 13 can be formed on the base substrate, or on the metal electrode film 12 formed on the base substrate, as described above. In either case, the base substrate can be used as the substrate 11 to obtain the piezoelectric thin film 1c or 1d in which the multilayer structure 16a or 16b is formed on the substrate 11.

Alternatively, another substrate may be disposed after removing the base substrate to obtain the piezoelectric thin film 1c or 1d in which the multilayer structure 16a or 16b is formed on the substrate 11. In the latter case, the another substrate can be disposed in contact with the $LaNiO_3$ film 13 or the metal electrode film 12, or the another substrate can be disposed in contact with the $(Bi,Na,Ba)TiO_3$ film 15.

[Ink Jet Head]

An ink jet head of the present invention will be described with reference to FIG. 2 to FIG. 12B.

Figure 2:
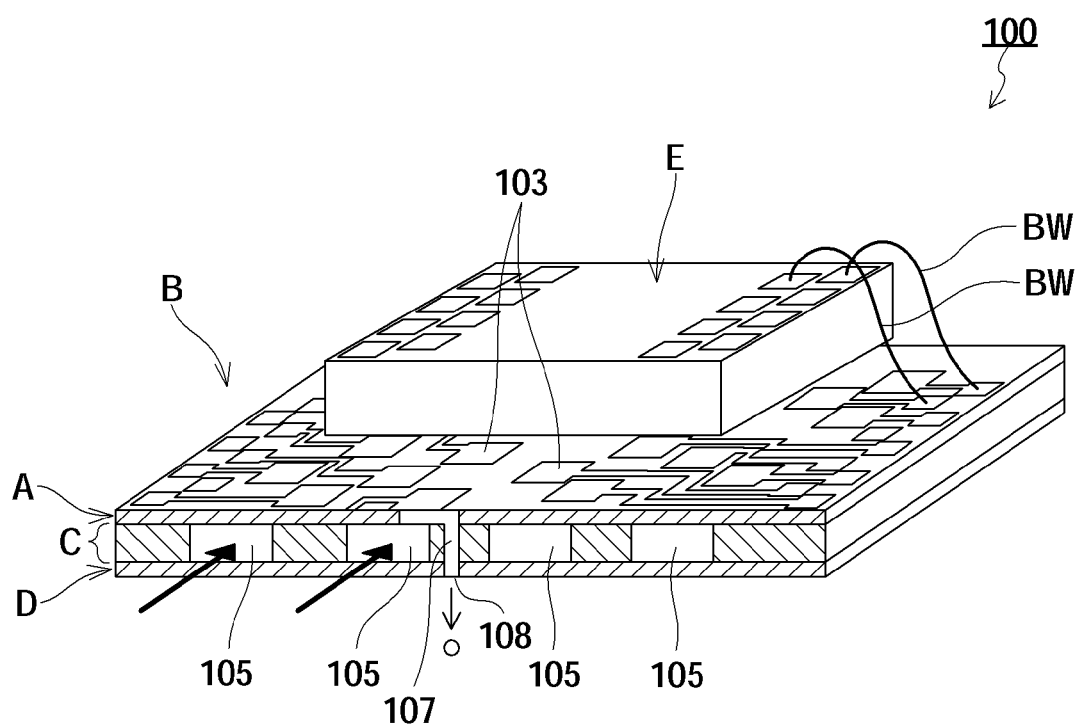
FIG. 2 is a perspective view schematically showing an example of an ink jet head of the present invention and partially showing a cross section of the ink jet head.
Figure 3:
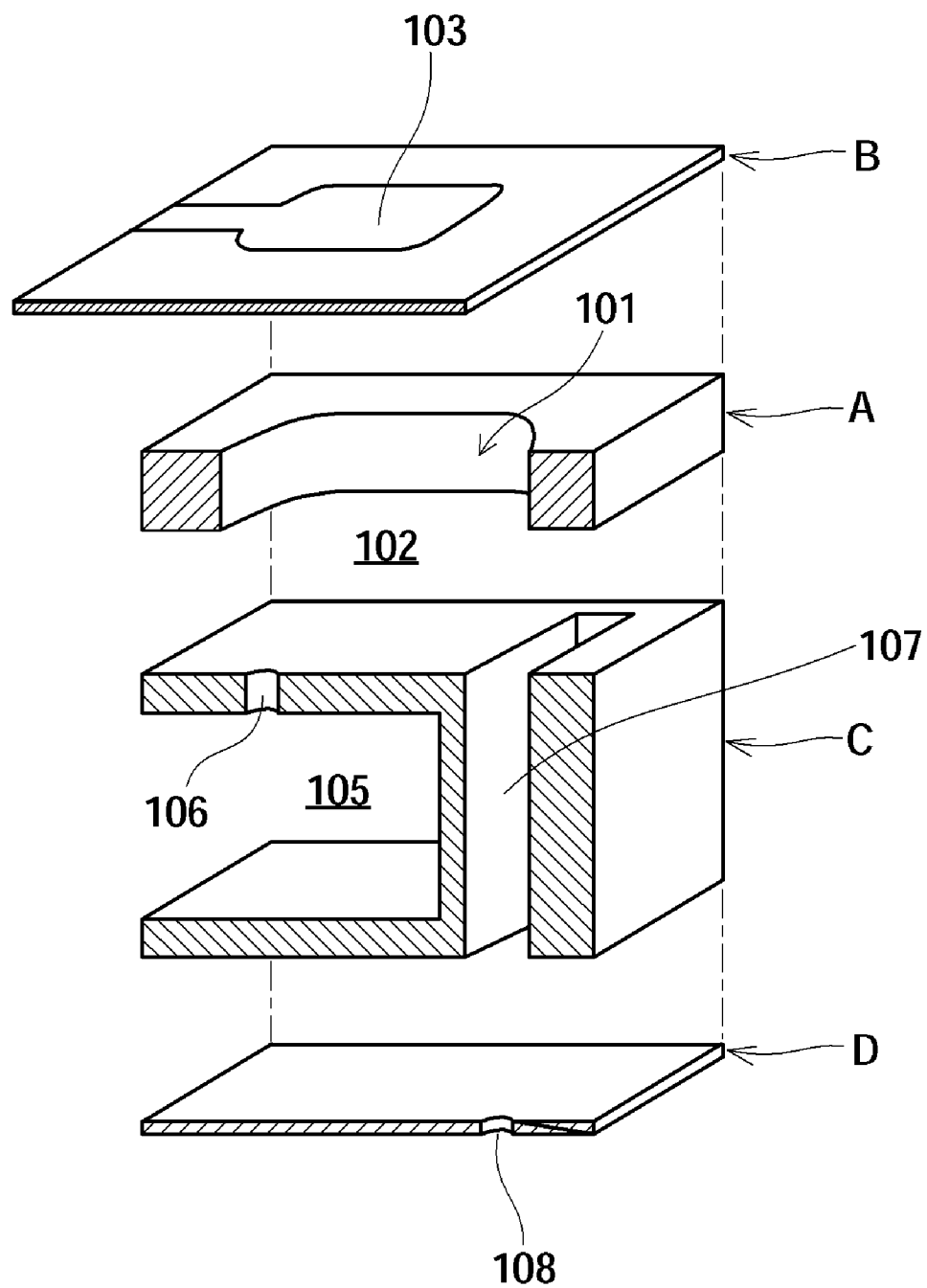
FIG. 3 is an exploded perspective view schematically showing main parts including a pressure chamber member and an actuator part in the ink jet head shown in FIG. 2 and partially showing a cross section of the main parts.

FIG. 2 shows an example of the ink jet head of the present invention. FIG. 3 is an exploded view showing main parts including a pressure chamber member and an actuator part in an ink jet head 100 shown in FIG. 2.

A reference character A in FIG. 2 and FIG. 3 indicates a pressure chamber member. The pressure chamber member A includes through-holes 101 that penetrate therethrough in its thickness direction (in the upward and downward directions in these diagrams) The through-hole 101 shown in FIG. 3 is a part of the through-hole 101 in the cross section in the thickness direction of the pressure chamber member A. A reference character B indicates an actuator part including piezoelectric thin films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric thin films and vibration layers that are aligned over the corresponding pressure chambers 102 respectively in plan view. In FIG. 2 and FIG. 3, a reference numeral 103 indicates an individual electrode layer that is a part of the piezoelectric thin film. As shown in FIG. 2, in the ink jet head 100, a plurality of individual electrode layers 103 are arranged in a zigzag pattern in plan view.

The ink passage member C has the common liquid chambers 105 arranged in stripes in plan view. In FIG. 2 and FIG. 3, each of the common liquid chambers 105 is aligned over a plurality of pressure chambers 102 in plan view. The common liquid chambers 105 extend in the ink supply direction (in the direction indicated by arrows in FIG. 2) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

Figure 4A:
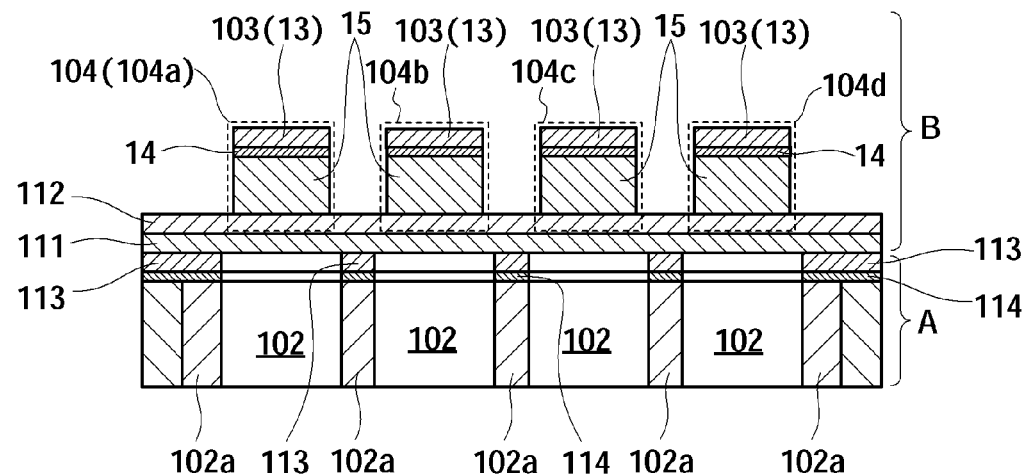
FIG. 4A is a cross-sectional view schematically showing an example of the main parts including the pressure chamber member and the actuator part in the ink jet head shown in FIG. 2.
Figure 4B:
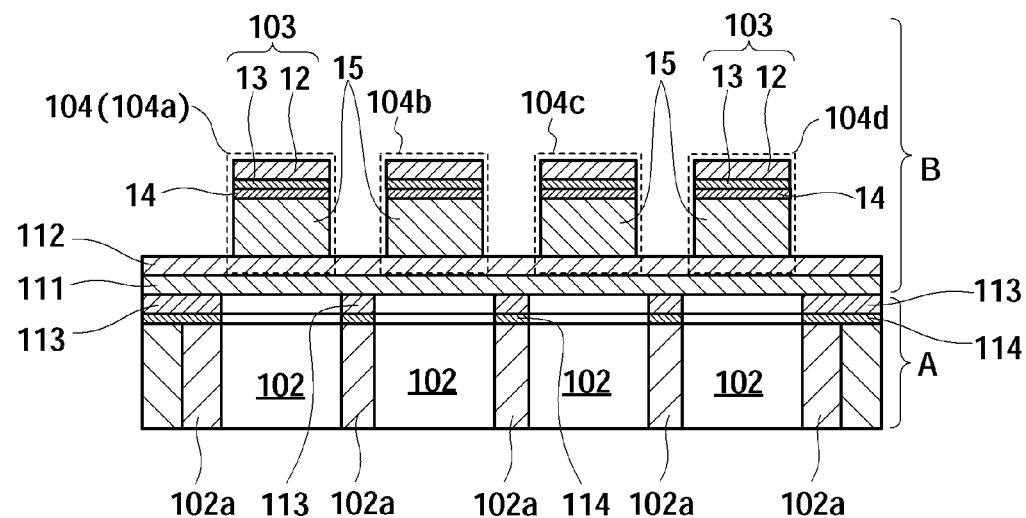
FIG. 4B is a cross-sectional view schematically showing another example of the main parts including the pressure chamber member and the actuator part in the ink jet head shown in FIG. 2.

FIG. 4A and FIG. 4B show the configuration of the main parts including the pressure chamber member A and the actuator part B. FIG. 4A and FIG. 4B show the cross section perpendicular to the ink supply direction (in the direction indicated by the arrows in FIG. 2) in the pressure chamber member A and the actuator part B. The actuator part B includes piezoelectric thin films 104 (104a to 104d) each having the piezoelectric layer 15 sandwiched between the first electrode (individual electrode layer 103) and the second electrode (common electrode layer 112). The individual electrode layers 103 correspond one to one to the piezoelectric thin films 104a to 104d. The common electrode layer 112 is a single layer electrode that is common to the piezoelectric thin films 104a to 104d.

Each of the piezoelectric thin films 104 shown in FIG. 4A has a structure in which the multilayer structure 16a shown in FIG. 1A further includes the common electrode layer 112. In this structure, the common electrode layer 112 is placed in contact with the piezoelectric layer 15 so that the interface layer 14 and the piezoelectric layer 15 are sandwiched between the common electrode layer 112 and the $LaNiO_3$ film 13 that is the individual electrode layer 103. This structure has the $LaNiO_3$ film 13 that is the individual electrode layer 103, the interface layer 14, the piezoelectric layer 15, and the common electrode layer 112 in this order from the side of the $LaNiO_3$ film 13.

Each of the piezoelectric thin films 104 shown in FIG. 4B has a structure in which the multilayer structure 16b shown in FIG. 1B further includes the common electrode layer 112. In this structure, the common electrode layer 112 is placed in contact with the piezoelectric layer 15 so that the interface layer 14 and the piezoelectric layer 15 are sandwiched between the common electrode layer 112 and the metal electrode film 12 and the $LaNiO_3$ film 13 that serve as the individual electrode layer 103. This structure has the metal electrode film 12 and the $LaNiO_3$ film 13 that serve as the individual electrode layer 103, the interface layer 14, the piezoelectric layer 15, and the common electrode layer 112 in this order from the side of the metal electrode film 12. The $LaNiO_3$ film 13 is formed on the metal electrode film 12.

The metal electrode film 12, the $LaNiO_3$ film 13, the interface layer 14, and the piezoelectric layer 15 in each of the piezoelectric thin films 104 shown in FIG. 4A and FIG. 4B are the same as those in the piezoelectric thin film of the present invention that has been described above, including the preferred embodiments thereof.

The common electrode layer 112 is not limited as long as it has conductivity. For example, the common electrode layer 112 is composed of a copper (Cu) electrode (electrode film). The common electrode layer 112 may be a Pt electrode (electrode film) having, on its surface, an adhesive layer made of a conductive material. Preferably, the conductive material is titanium (Ti). This is because titanium has high adhesion to the piezoelectric layer 15.

Both of the first electrode and the second electrode can be the individual electrode layers as long as a voltage applied between the first electrode and the second electrode can induce a deformation of the piezoelectric layer 15. That is, the piezoelectric thin film in the ink jet head of the present invention can include the common electrode layer 112, the interface layer 14, the piezoelectric layer 15, and the individual electrode layer 103 in this order. In this case, the common electrode layer 112 that is the first electrode is composed of the $LaNiO_3$ film 13. Alternatively, the common electrode layer 112 is formed of a laminate of the $LaNiO_3$ film 13 and the metal electrode film 12, and in this laminate, the $LaNiO_3$ film 13 is placed in contact with the interface layer 14. The individual electrode layer 103 that is the second electrode can be composed of a material having conductivity.

Preferably, the individual electrode layer 103 has a thickness of at least 0.05 μm but not more than 1 μm. When the individual electrode layer 103 is a laminate of the metal electrode film 12 and the LaNiO$_3$ film 13, it is preferable that the LaNiO$_3$ film 13 have a thickness of at least 0.05 μm but not more than 0.5 μm. It is preferable that the interface layer 14 have a thickness of at least 0.05 μm but not more than 0.5 μm. It is preferable that the piezoelectric layer 15 have a thickness of at least 0.5 μm but not more than 5 μm. It is preferable that the common electrode layer 112 have a thickness of at least 0.05 μm but not more than 0.5 μm.

The actuator part B further includes a vibration layer 111 that is bonded to the common electrode layer 112 of the piezoelectric thin film 104. The vibration layer 111 is displaced in its film thickness direction according to a deformation of the piezoelectric thin film 104 produced by a piezoelectric effect. A voltage application to the piezoelectric layer 15 through the individual electrode layer 103 and the common electrode layer 112 brings about a deformation of the piezoelectric thin film 104 produced by the piezoelectric effect.

The pressure chamber member A is bonded to the vibration layer 111 via the intermediate layer 113 and the adhesive layer 114. The pressure chamber member A and the piezoelectric thin film 104 sandwich the vibration layer 111 therebetween.

The structure of the vibration layer 111, the bonding state of the piezoelectric thin film 104 and the vibration layer 111, and the bonding state of the vibration layer 111 and the pressure chamber member A are not limited as long as the vibration layer 111 is displaceable according to a deformation of the piezoelectric thin film 104 produced by the piezoelectric effect, the volumetric capacity of the pressure chamber 102 changes according to a displacement of the vibration layer 111, and the ink in the pressure chamber 102 is ejected according to a change in the volumetric capacity of the pressure chamber 102. In FIG. 4A and FIG. 4B, the vibration layer 111 forms a wall of the pressure chamber 102.

The vibration layer 111 is composed, for example, of a Cr film. The vibration layer 111 can be composed of a film made of Ni, aluminum (Al), tantalum (Ta), tungsten (W), or silicon (Si), or of an oxide or nitride thereof (for example, silicon dioxide, aluminum oxide, zirconium oxide, or silicon nitride). Preferably, the vibration layer 111 has a thickness of at least 2 μm but not more than 5 μm.

The adhesive layer 114 is made of an adhesive or a glue. A person skilled in the art can select an appropriate type of adhesive or glue.

The intermediate layer (longitudinal wall) 113 prevents the adhesive layer 114 from adhering to a portion of the vibration layer 111 exposed to the pressure chamber 102 when the pressure chamber member A is bonded to the vibration layer 111 via the adhesive layer 114. The adhesive that has adhered to the portion inhibits the displacement of the vibration layer 111. The material for the intermediate layer 113 is not limited as long as the functions of the ink jet head 100 are maintained. An example of the material for the intermediate layer 113 is Ti. The intermediate layer 113 can be omitted.

The pressure chamber member A has partition walls 102$a$ between adjacent pressure chambers 102.

An example of the method of manufacturing the ink jet head 100 shown in FIG. 2 is described with reference to FIG. 5A to FIG. 10.

Figure 5A:
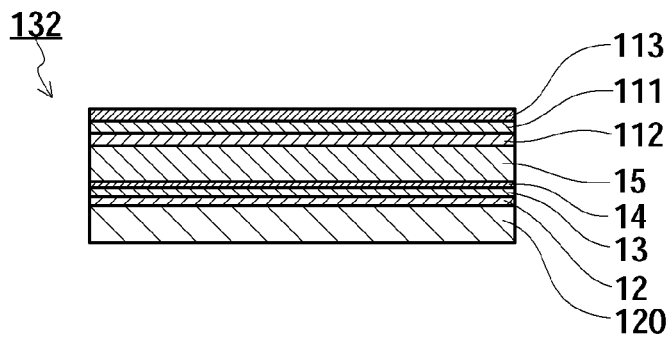
FIG. 5A is a cross-sectional view schematically showing a step of forming a laminate including a piezoelectric layer in an example of a method of manufacturing the ink jet head shown in FIG. 2.

First, as shown in FIG. 5A, the metal electrode film 12, the LaNiO$_3$ film 13, the interface layer 14, the piezoelectric layer 15, the common electrode layer 112, the vibration layer 111, and the intermediate layer 113 are formed in this order on the base substrate 120 to obtain a laminate 132. A thin film formation technique for forming the respective layers (and films) is not particularly limited. Examples of the thin film formation technique include PLD, CVD, sol-gel processing, and AD. Sputtering is preferably used as the technique.

Figure 5B:
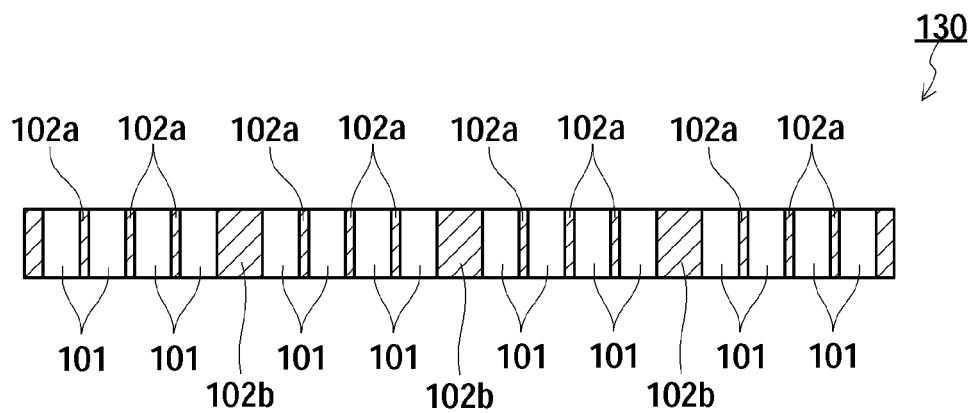
FIG. 5B is a cross-sectional view schematically showing a step of forming a member, which serves as the pressure chamber member later, in the example of the method of manufacturing the ink jet head shown in FIG. 2.

Apart from the formation of the laminate 132, a member, which serves as the pressure chamber member A later, is formed. This member is formed, for example, by microfabricating a Si substrate (preferably, a monocrystalline Si substrate). It is preferable that the Si substrate be larger in size than the base substrate 120 (see FIG. 10). More specifically, as shown in FIG. 5B, a plurality of through-holes 101 are formed in the substrate 130. The through-holes 101 serve as the pressure chambers 102 after this member is bonded to the separately formed actuator part and ink passage member. In FIG. 5B, one through-hole group consists of four through-holes 101, and the substrate 130 includes a plurality of through-hole groups. A first partition wall 102$a$ is a partition of adjacent two through-holes 101 belonging to one through-hole group. A second partition wall 102$b$ is a partition of adjacent two through-hole groups. Preferably, the thickness of the second partition wall 102$b$ is at least twice as large as that of the first partition wall 102$a$. The through-hole 101 can be provided in the substrate 130 by well-known microfabrication techniques, for example, a combination of patterning and etching. The shape of the through-hole 101 can be conformed to a desired shape of the pressure chamber 102. Hereinafter, the first partition walls 102$a$ and the second partition walls 102$b$ are referred to as partition walls 102 collectively.

Figure 5C:
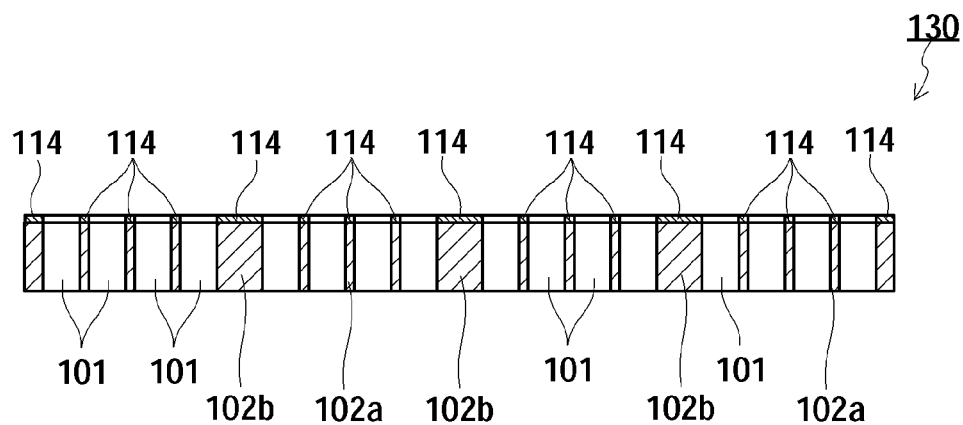
FIG. 5C is a cross-sectional view schematically showing a step of forming an adhesive layer in the example of the method of manufacturing the ink jet head shown in FIG. 2.

Next, as shown in FIG. 5C, the adhesive layer 114 is formed on the partition wall 102. The formation method of the adhesive layer 114 is not limited. An example of the method is electrodeposition.

Figure 6A:
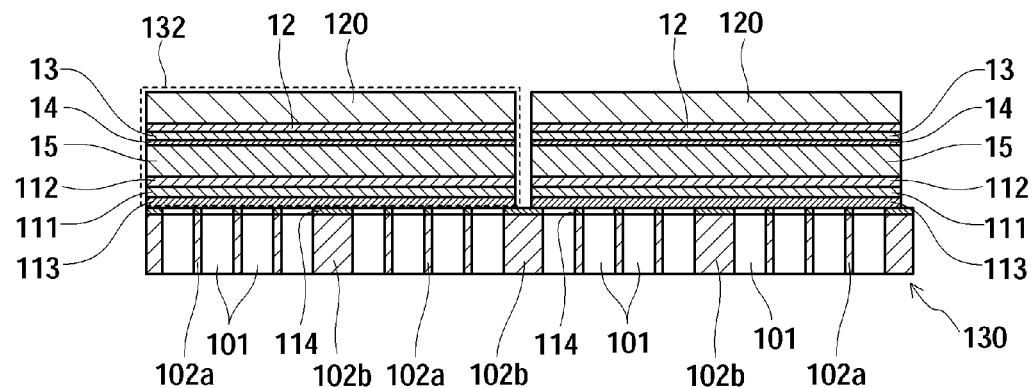
FIG. 6A is a cross-sectional view schematically showing a step of bonding the laminate formed in the step shown in FIG. 5A and the member formed in the step shown in FIG. 5B, in the example of the method of manufacturing the ink jet head shown in FIG. 2.
Figure 10:
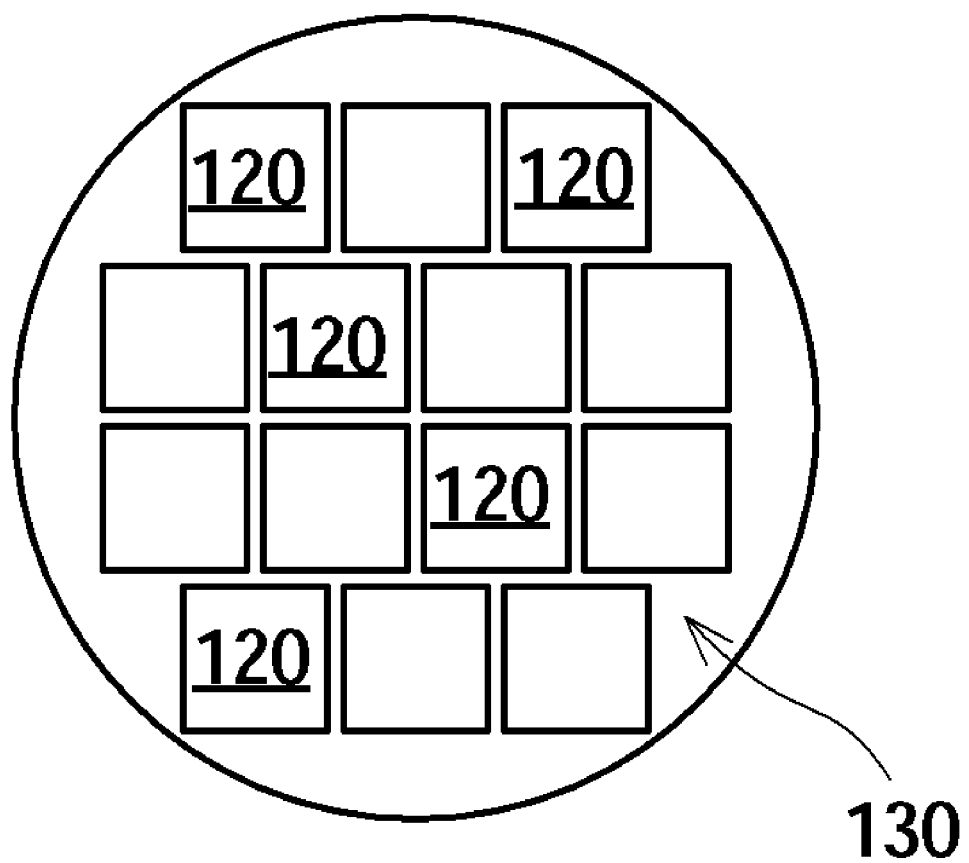
FIG. 10 is a plan view schematically showing an example of an arrangement in which a laminate serving later as the actuator part is placed on a substrate serving later as the pressure chamber member.

Then, as shown in FIG. 6A, the substrate 130 is bonded to the laminate 132. The intermediate layer 113 is sandwiched between the substrate 130 and the laminate 132. When the substrate 130 is larger in size than the base substrate 120, a plurality of laminates 132 (14 laminates in the example shown in FIG. 10) can be bonded to the substrate 130, as shown in FIG. 10. In FIG. 6A, two laminates 132 are bonded to the substrate 130. In FIG. 6A, the center of each of the two laminates 132 is positioned on the extension of the second partition wall 102$b$.

When a thermosetting adhesive is used as the adhesive layer 114, it is preferable that after the substrate 130 is bonded to the laminate 132, heat be applied to cure the adhesive layer 114 completely. The adhesive layer 114 that has spread into the through-hole 101 during the bonding can be removed by plasma treatment.

Figure 6B:
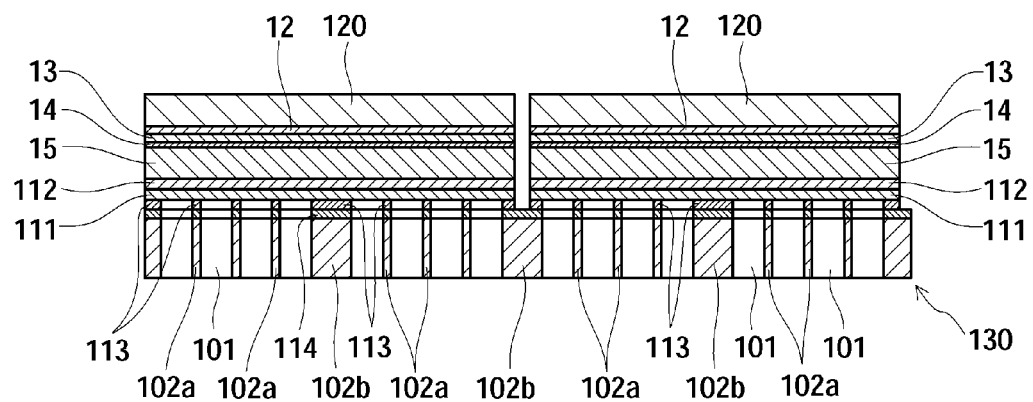
FIG. 6B is a cross-sectional view schematically showing a step (a step of etching an intermediate layer) following the step shown in FIG. 6A in the example of the method of manufacturing the ink jet head shown in FIG. 2.

Next, as shown in FIG. 6B, the intermediate layer 113 is etched into the cross-sectional shape of the through-holes 101 by using the partition walls 102 as a mask. Thus, the vibration layer 111 is exposed to the through-holes 101. This etching transforms the shape of the intermediate layer 113 into the same shape as the partition walls 102 in plan view. The intermediate layer 113 as well as the partition wall 102 and the adhesion layer 114 form a longitudinal wall. In this manner, the pressure chamber member A including the substrate 130, the intermediate layer 113, and the adhesive layer 114 is formed.

In the example shown in FIG. 5B to FIG. 6B, the substrate 130 in which the through-holes 101 are formed is bonded to the laminates 132 including the piezoelectric layers 15. The pressure chamber member A also can be formed, instead of the above procedure, by bonding the substrate 130 having no through-hole 101 to the laminates 132 and then forming the through-holes 101 in the substrate 130 to expose the vibration layer 111.

Figure 7A:
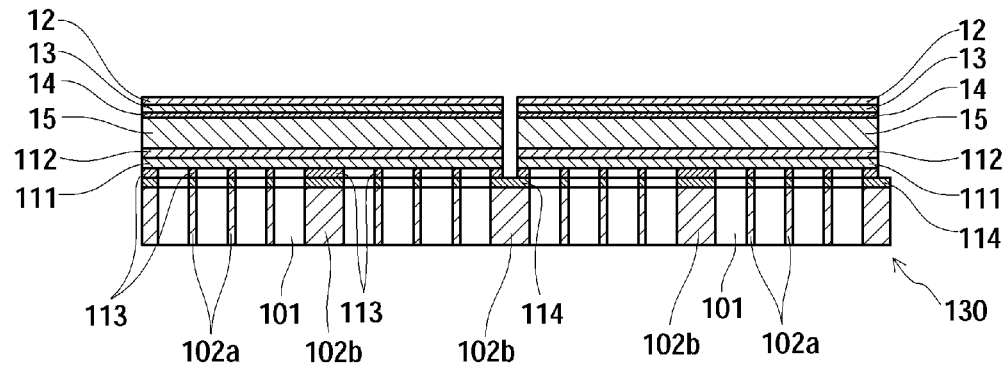
FIG. 7A is a cross-sectional view schematically showing a step (a step of removing a base substrate) following the step shown in FIG. 6B in the example of the method of manufacturing the ink jet head shown in FIG. 2.

Then, as shown in FIG. 7A, the base substrate 120 is removed by, for example, etching.

Figure 7B:
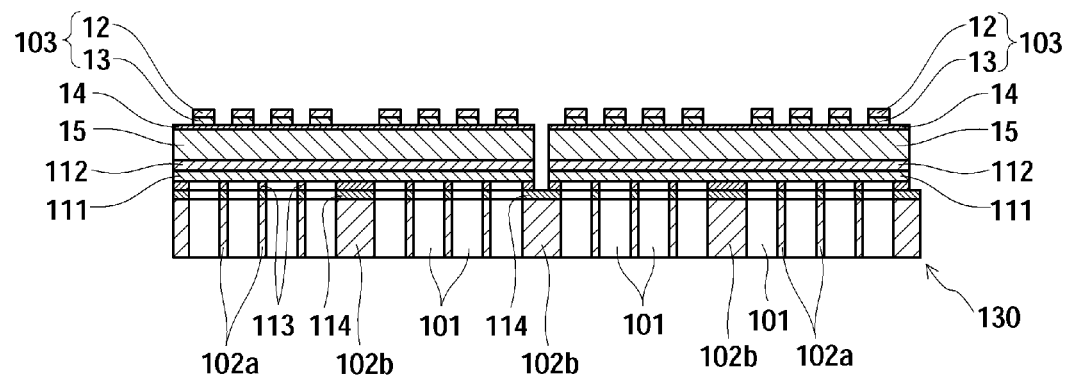
FIG. 7B is a cross-sectional view schematically showing a step (a step of forming an individual electrode layer) following the step shown in FIG. 7A in the example of the method of manufacturing the ink jet head shown in FIG. 2.

Next, as shown in FIG. 7B, the metal electrode film 12 and the LaNiO$_3$ layer 13 are transformed into a plurality of individual electrode layers 103 by a combination of microfabrications of photolithography and etching. The individual electrode layers 103 correspond one to one to the through-holes 101 in plan view.

Figure 8A:
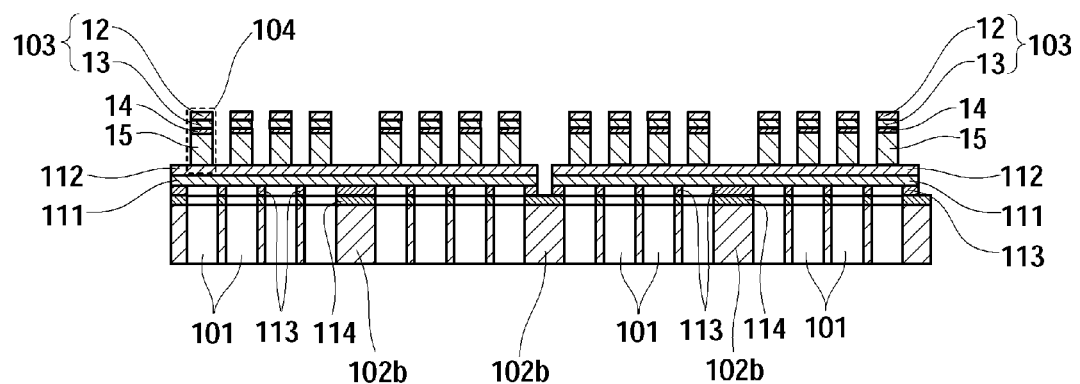
FIG. 8A is a cross-sectional view schematically showing a step (a step of microfabricating the piezoelectric layer) following the step shown in FIG. 7B in the example of the method of manufacturing the ink jet head shown in FIG. 2.

Then, as shown in FIG. 8A, the interface layer 14 and the piezoelectric layer 15 are subjected to microfabrication. Both of the interface layer 14 and the piezoelectric layer 15 have the same shape as the individual electrode layer 103 in plan view. It is preferable that in this microfabrication, the center of the respective layers (and films) coincide with the center of the through-hole 101 with high accuracy in plan view. In this manner, the actuator part B including the vibration layers 111, and the piezoelectric thin films 104 each composed of the individual electrode layer 103 (the metal electrode film 12 and the LaNiO$_3$ film 13), the interface layer 14, the piezoelectric layer 15, and the common electrode layer 112, is formed.

Figure 8B:
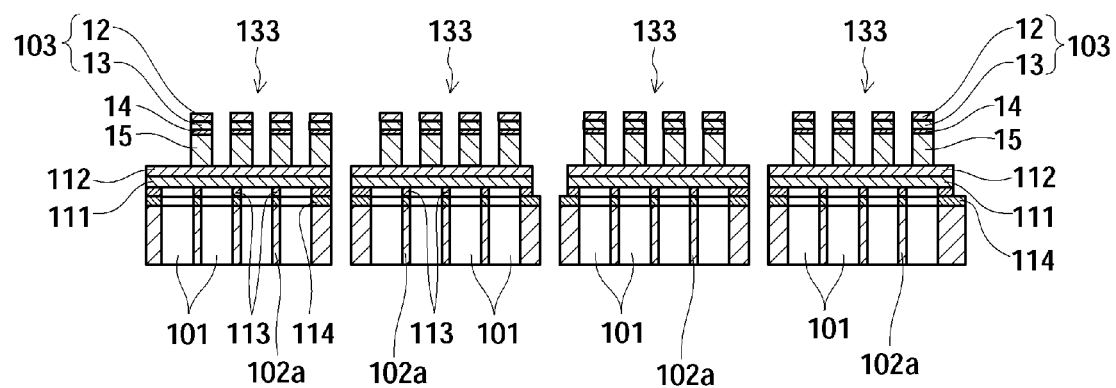
FIG. 8B is a cross-sectional view schematically showing a step (a step of cutting the substrate) following the step shown in FIG. 8A in the example of the method of manufacturing the ink jet head shown in FIG. 2.

Next, as shown in FIG. 8B, the common electrode layers 112, the vibration layers 111, and the substrate 130 are cut along the respective second partition walls 102b to obtain a plurality of members 133. Each of the members 133 includes the actuator part B, and the pressure chamber member A having a plurality of through-holes 101. The actuator part B is bonded to the pressure chamber member A.

Figure 9A:
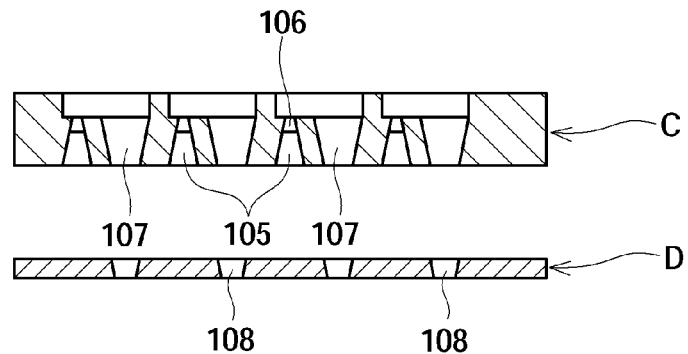
FIG. 9A is a cross-sectional view schematically showing a step of preparing an ink passage member and a nozzle plate in the example of the method of manufacturing the ink jet head shown in FIG. 2.

Apart from the above processes, as shown in FIG. 9A, the ink passage member C including the common liquid chambers 105, the supply ports 106, and the ink passages 107, and the nozzle plate D including the nozzle holes 108 are prepared.

Figure 9B:
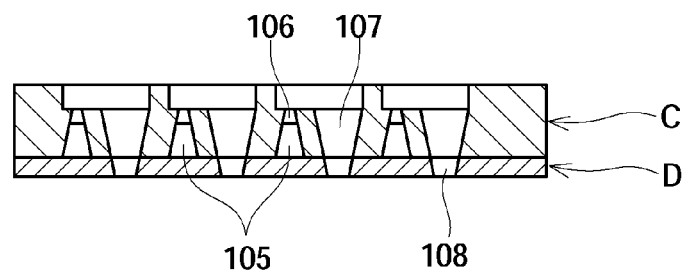
FIG. 9B is a cross-sectional view schematically showing a step of bonding the ink passage member and the nozzle plate in the example of the method of manufacturing the ink jet head shown in FIG. 2.

Next, as shown in FIG. 9B, the ink passage member C is bonded to the nozzle plate D so that the ink passages 107 are aligned over the corresponding nozzle holes 108 when viewed from the direction perpendicular to the main surface of the ink passage member C. Thus, a combined member is obtained. Preferably, the entire nozzle hole 108 is exposed from the ink passage 107. The bonding method is not limited. For example, an adhesive can be used.

Figure 9C:
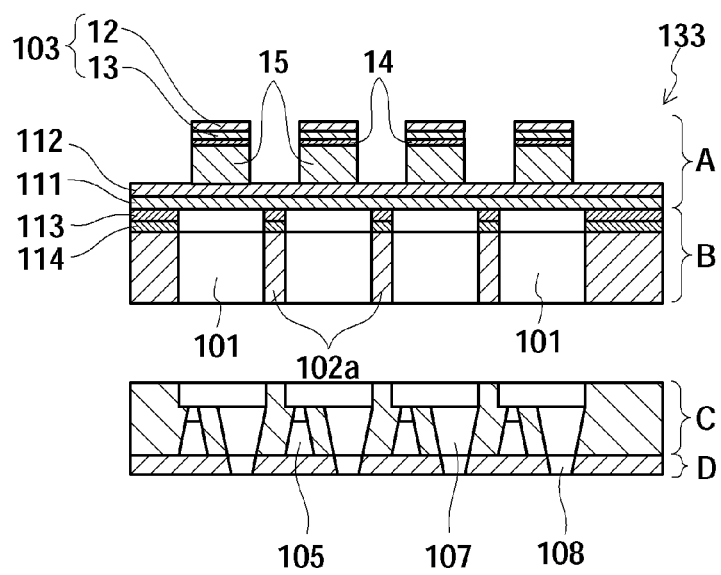
FIG. 9C is a cross-sectional view schematically showing a step of bonding a combined member of the actuator part and the pressure chamber member and a combined member of the ink passage member and the nozzle plate in the example of the method of manufacturing the ink jet head shown in FIG. 2.
Figure 9D:
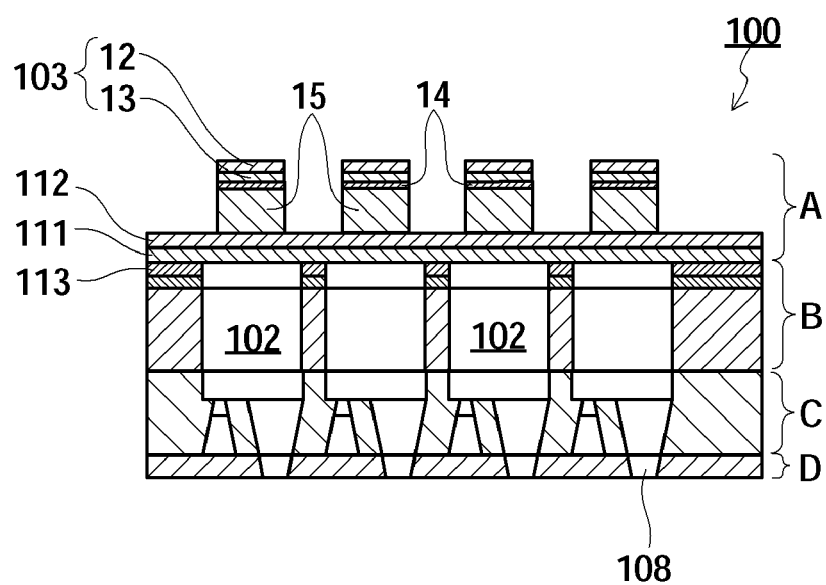
FIG. 9D is a cross-sectional view schematically showing an ink jet head obtained by the steps shown in FIG. 5A to FIG. 9C.

Then, as shown in FIG. 9C, the member 133 is bonded to the combined member prepared in the step shown in FIG. 9B. More specifically, the surface of the pressure chamber member A opposite to the actuator part B is bonded to the surface of the ink passage member C opposite to the nozzle plate D. When they are bonded, their alignment is adjusted, and thus this bonding allows the through-holes 101 to serve as the pressure chambers 102. The bonding method is not limited, and for example, an adhesive is used. In this manner, the ink jet head 100 shown in FIG. 9D (FIG. 2) is obtained.

A person skilled in the art can employ the method shown in FIG. 5A to FIG. 10 to manufacture an ink jet head including the piezoelectric thin film 104 having no metal electrode film 12.

Figure 11:
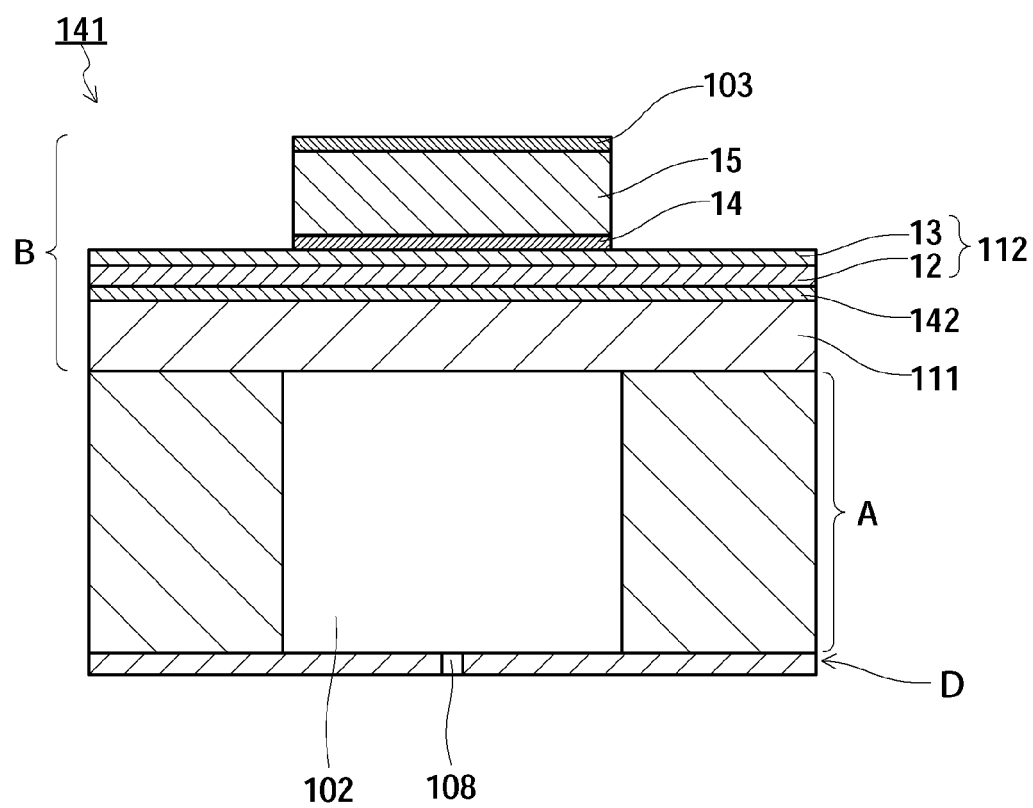
FIG. 11 is a cross-sectional view schematically showing another example of the ink jet head of the present invention.

FIG. 11 shows another ink jet head of the present invention. An ink jet head 141 shown in FIG. 11 has a simpler structure than the ink jet head 100 shown in FIG. 2 to FIG. 4. Specifically, the ink passage member C is removed from the ink jet head 100.

The ink jet head 141 shown in FIG. 11 is the same as the ink jet head 100 shown in FIG. 2 to FIG. 4 except the following points (1) to (6): (1) the ink passage member C is not included, and the nozzle plate D having the nozzle holes 108 is bonded directly to the pressure chamber member A; (2) the intermediate layer 113 is not included, and the vibration layer 111 is bonded directly to the pressure chamber member A; (3) an adhesive layer 142 is disposed between the vibration layer 111 and the common electrode layer 112 to improve the adhesion therebetween; (4) the common electrode layer 112 is a laminate of the metal electrode film 12 and the LaNiO$_3$ film 13; (5) the individual electrode layer 103 is composed of a conductive material; and (6) the common electrode layer 112 (the metal electrode film 12 and the LaNiO$_3$ film 13), the interface layer 14, the piezoelectric layer 15, and the individual electrode layer 103 are laminated in this order from the side of the common electrode layer 112.

The common electrode layer 112 serves as the first electrode. The individual electrode layer 103 serves as the second electrode. The material of the adhesive layer 142 is, for example, Ti.

Figure 12A:
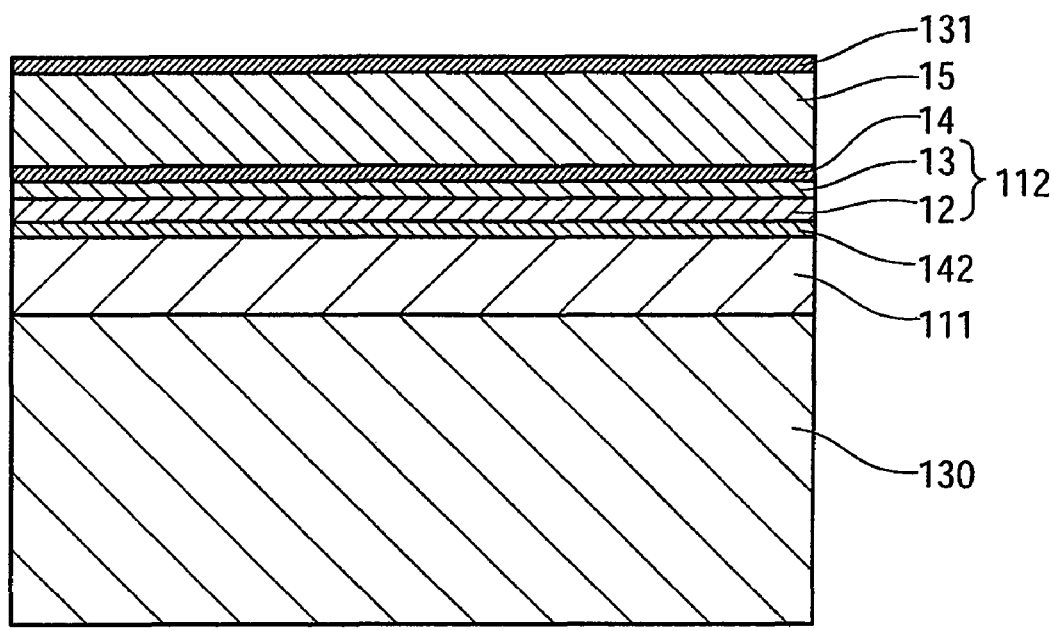
FIG. 12A is a schematic cross-sectional view for explaining the example of the method of manufacturing the ink jet head shown in FIG. 11.
Figure 12B:
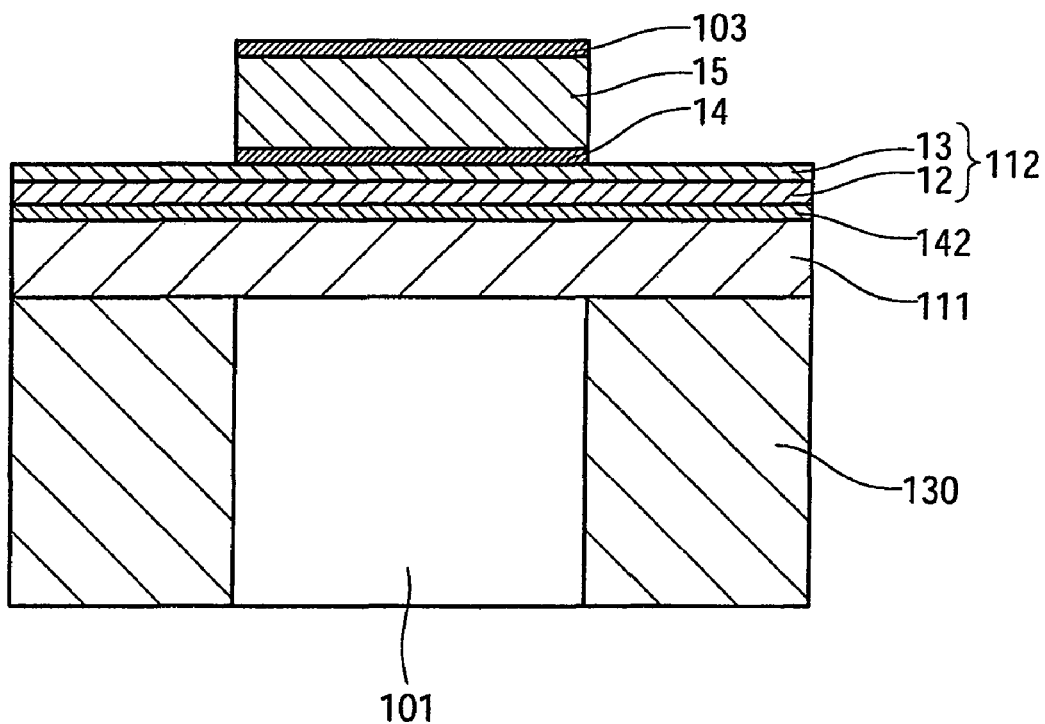
FIG. 12B is a schematic cross-sectional view for explaining the example of the method of manufacturing the ink jet head shown in FIG. 11.

The ink jet head 141 shown in FIG. 11 can be manufactured, for example, by a method shown in FIG. 12A and FIG. 12B. First, as shown in FIG. 12A, the vibration layer 111, the adhesive layer 142, the common electrode layer 112 (the metal electrode film 12 and the LaNiO$_3$ film 13), the interface layer 14, the piezoelectric layer 15, and the electrode layer 131 are formed in this order on one of the main surfaces of the substrate 130.

Next, as shown in FIG. 12B, the through-hole 101 is formed at the position of the substrate 130 where the pressure chamber 102 is to be formed. The electrode layer 131, the piezoelectric layer 15, and the interface layer 14 are subjected to microfabrication so that the center of the through-hole 101 coincides with the center of these layers when viewed from the direction perpendicular to the main surface of the substrate 130. As a result of this microfacrication, the individual electrode layer 103 is formed from the electrode layer 131. A well-known microfabrication technique like a combination of patterning and etching can be used for the formation of the through-hole 101 and the microfabrication of these respective layers. As etching, dry etching is preferred. Anisotropic dry etching is preferred for the formation of the through-hole 101. In dry etching, a gas mixture of argon and an organic gas containing fluorine atoms can be used.

Finally, the substrate 130 is bonded to the separately formed nozzle plate having the nozzle holes 108. Thus, the ink jet head 141 shown in FIG. 11 is obtained. When they are bonded, their alignment is adjusted so that this bonding allows the through-holes 101 to serve as the pressure chambers 102. The bonding method is not limited, and for example, an adhesive is used.

[Image Forming Method with Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character.

[Angular Velocity Sensor]

Figure 13A:
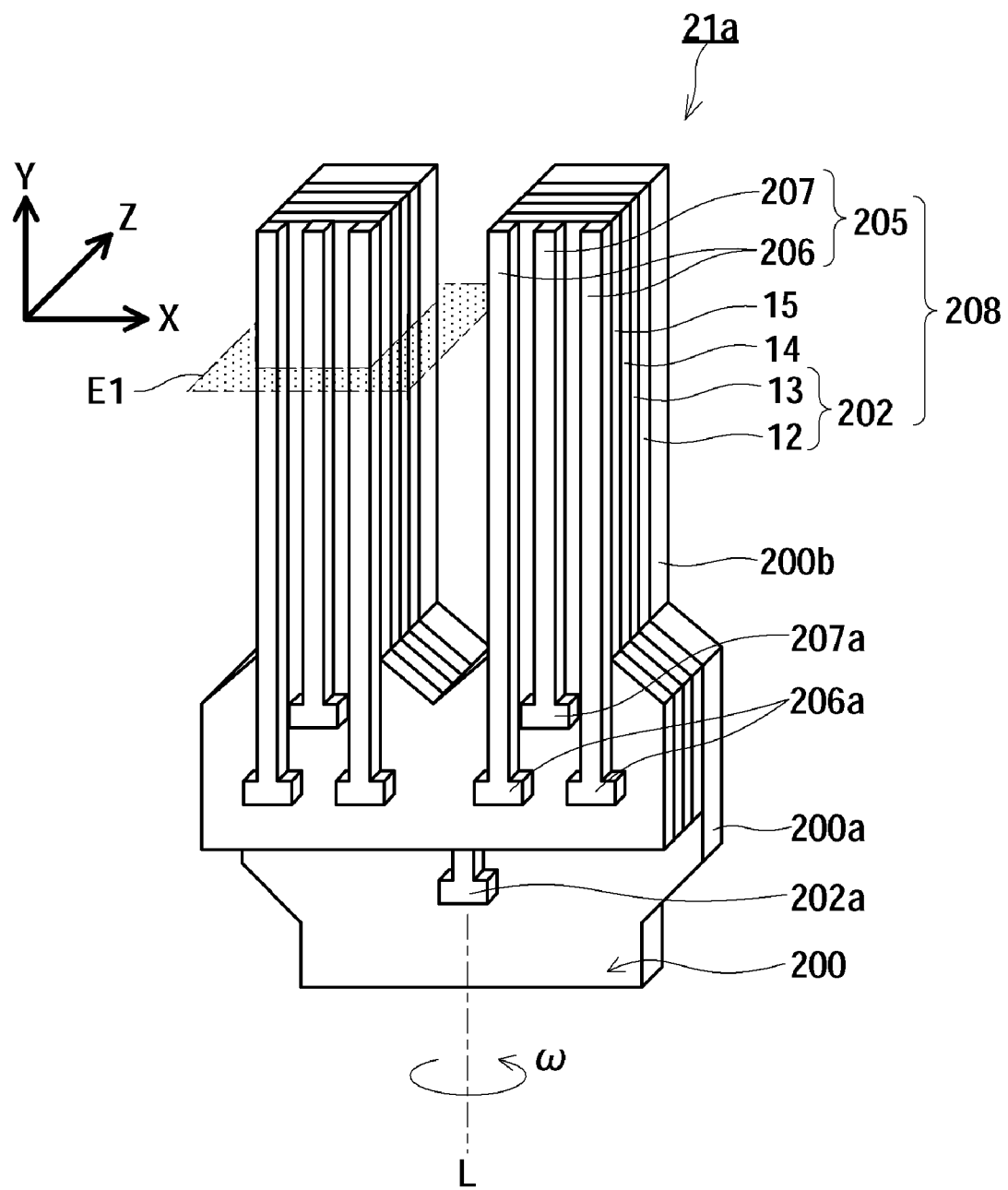
FIG. 13A is a perspective view schematically showing an example of an angular velocity sensor of the present invention.
Figure 13B:
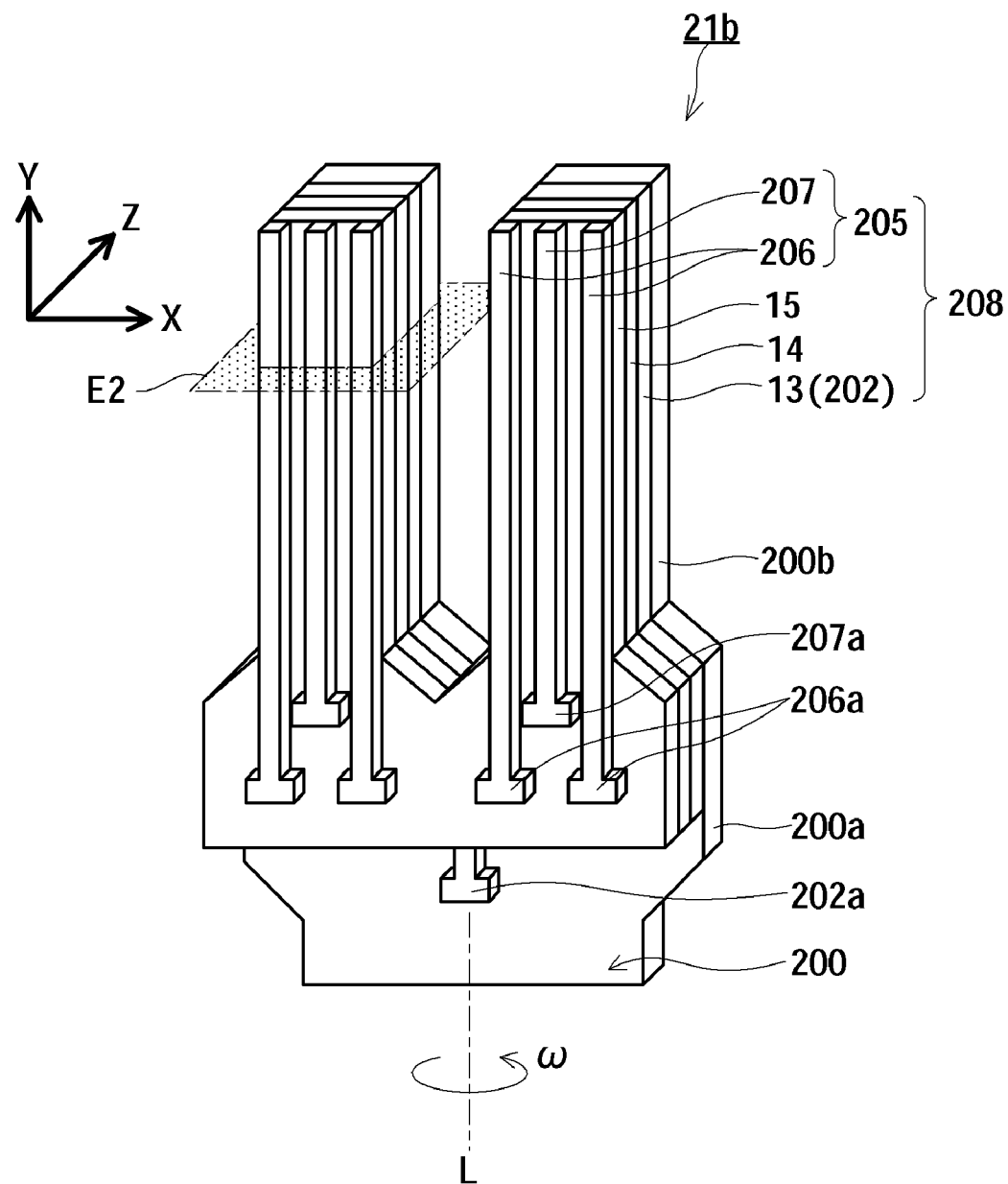
FIG. 13B is a perspective view schematically showing another example of the angular velocity sensor of the present invention.
Figure 14A:
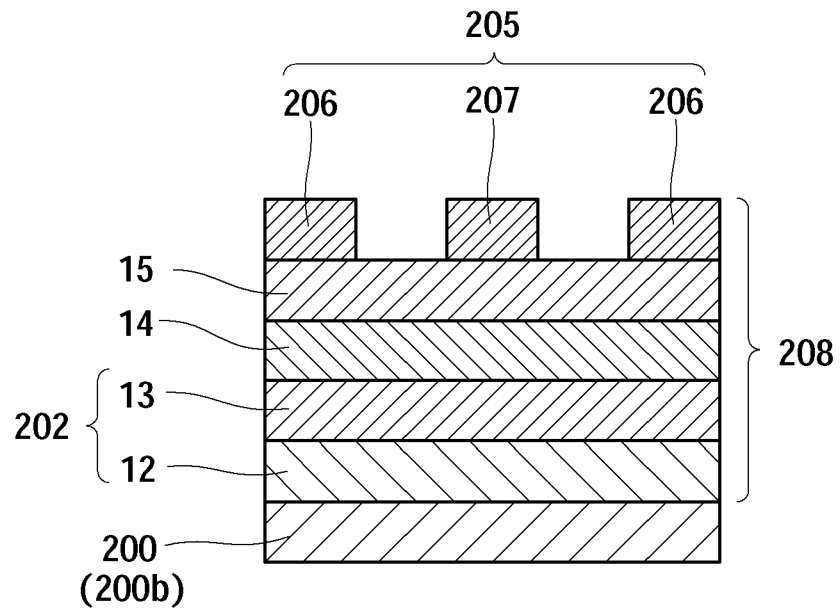
FIG. 14A is a cross-sectional view showing a cross section E1 of the angular velocity sensor shown in FIG. 13A.
Figure 14B:
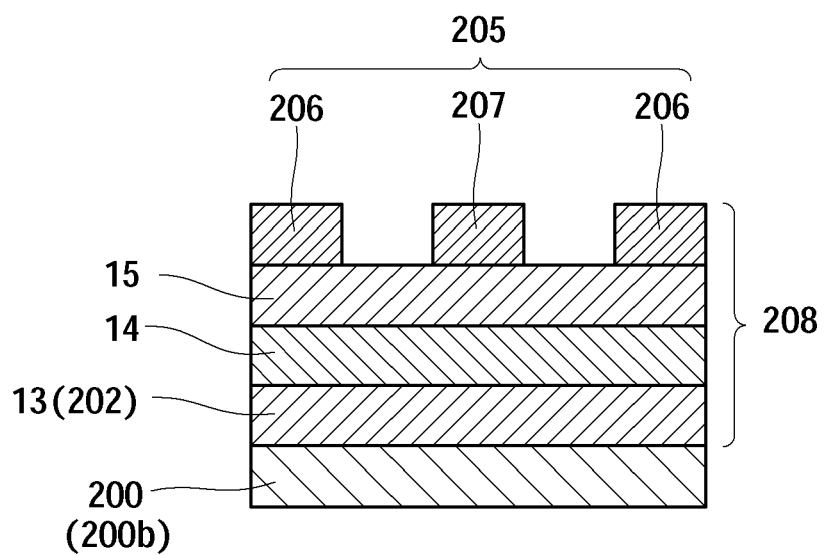
FIG. 14B is a cross-sectional view showing a cross section E2 of the angular velocity sensor shown in FIG. 13B.

FIG. 13A, FIG. 13B, FIG. 14A, and FIG. 14B show examples of an angular velocity sensor of the present invention. FIG. 14A shows a cross section E1 of an angular velocity sensor 21a shown in FIG. 13A. FIG. 14B shows a cross section E2 of an angular velocity sensor 21b shown in FIG. 13B. The angular velocity sensors 21a and 21b shown in FIG.

13A to FIG. 14B are so-called tuning-fork type angular velocity sensors. This type of angular velocity sensor can be used in a navigation apparatus for a vehicle, and as a sensor for correcting image blurring due to hand movement in a digital still camera.

The angular velocity sensors 21a and 21b shown in FIG. 13A to FIG. 14B each include a substrate 200 having vibration parts 200b and piezoelectric thin films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Specifically, it is the Y direction in FIG. 13A and FIG. 13B. The substrate 200 has a shape of a tuning fork including two arms (vibration parts 200b), when viewed from the thickness direction of the substrate 200 (the Z direction in FIG. 13A and FIG. 13B).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensors 21a and 21b can develop. More specifically, the substrate 200 has a thickness of at least 0.1 mm but not more than 0.8 mm. The thickness of the stationary part 200a can be different from that of the vibration part 200b.

The piezoelectric thin film 208 is bonded to the vibration part 200b. The piezoelectric thin film 208 includes the piezoelectric layer 15, the interface layer 14, the first electrode 202, and the second electrode 205. The piezoelectric layer 15 is sandwiched between the first electrode 202 and the second electrode 205. The piezoelectric thin film 208 has a multilayer structure in which the first electrode 202, the interface layer 14, the piezoelectric layer 15, and the second electrode 205 are laminated in this order.

In the piezoelectric thin film 208 shown in FIG. 13A and FIG. 14A, the first electrode 202 is a laminate of the metal electrode film 12 and the $LaNiO_3$ film 13. The $LaNiO_3$ film 13 is in contact with the interface layer 14. This piezoelectric thin film 208 has a multilayer structure in which the metal electrode film 12, the $LaNiO_3$ film 13, the interface layer 14, the piezoelectric layer 15, and the second electrode 205 are laminated in this order. That is, the piezoelectric thin film 208 shown in FIG. 13A and FIG. 14A has a structure in which the multilayer structure 16b shown in FIG. 1B further includes the second electrode 205.

In the piezoelectric thin film 208 shown in FIG. 13B and FIG. 14B, the first electrode 202 is the $LaNiO_3$ film 13. This piezoelectric thin film 208 has a multilayer structure in which the $LaNiO_3$ film 13, the interface layer 14, the piezoelectric layer 15, and the second electrode 205 are laminated in this order. That is, the piezoelectric thin film 208 shown in FIG. 13B and FIG. 14B has a structure in which the multilayer structure 16a shown in FIG. 1A further includes the second electrode 205.

The metal electrode film 12, the $LaNiO_3$ film 13, the interface layer 14, and the piezoelectric layer 15 in each of the piezoelectric thin films 208 shown in FIG. 13A to FIG. 14B are the same as those in the piezoelectric thin film of the present invention that has been described above, including the preferred embodiments thereof.

The second electrode 205 can be made of, for example, a Cu electrode film. The Cu electrode is preferable for the second electrode 205 because of its excellent adhesion to the piezoelectric layer 15. The second electrode 205 can be a Pt electrode or an Au electrode having, on its surface, an adhesive layer made of a conductive material. Since Ti has high adhesion to the piezoelectric layer 15, it can be used as a material for the adhesive layer.

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 13A and FIG. 13B). More specifically, in FIG. 13A to FIG. 14B, a pair of drive electrodes 206 are provided on both of the width-direction edge portions of the vibration part 200b along the length direction thereof (the Y direction in FIG. 13A and FIG. 13B). Only one drive electrode 206 may be provided on one of the width-direction edge portions of the vibration part 200b. In FIG. 13A to FIG. 14B, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 13A and FIG. 13B).

In the angular velocity sensor of the present invention, one of the first electrode and the second electrode selected therefrom can be composed of an electrode group including the drive electrode and the sense electrode. In each of the angular velocity sensors 21a and 21b shown in FIG. 13A to FIG. 14B, the second electrode 205 is composed of the electrode group. Unlike this angular velocity sensor, the first electrode 202 can be composed of the electrode group. As an example, the second electrode 205, the piezoelectric layer 15, the interface layer 14, and the first electrode 202 (the first electrode includes the $LaNiO_3$ film 13 that is in contact with the interface layer 14) can be laminated in this order, when viewed from the substrate 200.

The first electrode 202, the drive electrode 206, and the sense electrode 207 have connection terminals 202a, 206a, and 207a, respectively, formed at the end portions thereof. The shape and position of each of the connection terminals are not limited. In FIG. 13A and FIG. 13B, the connection terminals are provided on the stationary part 200a.

Preferably, the first electrode 202 has a thickness of at least 0.05 μm but not more than 1 μm. When the first electrode 202 is a laminate of the metal electrode film 12 and the $LaNiO_3$ film 13, it is preferable that the $LaNiO_3$ film 13 have a thickness of at least 0.05 μm but not more than 0.5 μm. It is preferable that the interface layer 14 have a thickness of at least 0.05 μm but not more than 0.5 μm. It is preferable that the piezoelectric layer 15 have a thickness of at least 0.5 μm but not more than 5 μm. It is preferable that the second electrode 205 have a thickness of at least 0.05 μm but not more than 0.5 μm.

In FIG. 13A to FIG. 14B, the piezoelectric thin film 208 is bonded to both the vibration part 200b and the stationary part 200a. The bonding state of the piezoelectric thin film 208 is not limited as long as the piezoelectric thin film 208 can oscillate the vibration part 200b and measure the deformation of the vibration part 200b. For example, the piezoelectric thin film 208 may be bonded only to the vibration part 200b.

The angular velocity sensor of the present invention may have two or more vibration part groups each consisting of a pair of vibration parts 200b. Such an angular velocity sensor serves as a biaxial or triaxial angular velocity sensor capable of measuring angular velocities with respect to a plurality central axes of rotation. The angular velocity sensors shown in FIG. 13A to FIG. 14B each have one vibration part group consisting of a pair of vibration parts 200b.

The angular velocity sensor of the present invention is manufactured, for example, by the following method using the above-mentioned piezoelectric thin film manufacturing method. The following method is used in the case where the first electrode 202 includes the metal electrode film 12. A person skilled in the art can apply the following method also to the case where the first electrode 202 does not include the metal electrode film 12.

First, the metal electrode film 12, the LaNiO$_3$ film 13, the interface layer 14, the piezoelectric layer 15, and the electrode layer are formed on the surface of a substrate (for example, a Si substrate) in this order. The above-mentioned thin film formation techniques can be employed to form the respective layers (and films).

Next, the electrode layer is patterned using a microfabrication technique to form the second electrode 205 including the drive electrode 206 and the sense electrode 207. Furthermore, the piezoelectric layer 15, the interface layer 14, the LaNiO$_3$ film 13, and the metal electrode film 12 are patterned using a microfabrication technique. Then, the substrate is patterned using the microfabrication technique to form the vibration part 200b. In this manner, the angular velocity sensor of the present invention can be manufactured.

The microfabrication technique is, for example, dry etching.

A transfer technique using a base substrate can be applied to the manufacture of the angular velocity sensor of the present invention. Specifically, the following method can be used, for example. First, the metal electrode film 12, the LaNiO$_3$ film 13, the interface layer 14, the piezoelectric layer 15, and the electrode layer are formed on the surface of a base substrate in this order. Next, the laminate thus formed is bonded to another new substrate so that the substrate and the electrode layer are in contact with each other. Next, the base substrate is removed by a well-known technique. Next, the respective layers (and films) are patterned using a microfabrication technique. Thus, the angular velocity sensor of the present invention can be manufactured. The laminate and the new substrate can be bonded together via, for example, an adhesive layer. The material for the adhesive layer is not limited as long as the laminate is bonded stably to the new substrate. More specifically, an acrylic resin adhesive, an epoxy resin adhesive, a silicone adhesive, or a polyimide adhesive can be used. In this case, it is preferable that the adhesive layer have a thickness of at least 0.2 µm but not more than 1 µm.

[Method of Measuring Angular Velocity with Angular Velocity Sensor]

The angular velocity measuring method of the present invention uses the angular velocity sensor of the present invention, and includes the steps of: applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method with the angular velocity sensors 21a and 21b shown in FIGS. 13A and 13B is described. A driving voltage having a frequency that resonates with the natural vibration of the vibration part 200b is applied to the piezoelectric layer 15 through the first electrode 202 and the drive electrode 206 so as to oscillate the vibration part 200b. The piezoelectric layer 15 is deformed in accordance with the waveform of the applied driving voltage, and the vibration part 200b bonded to the piezoelectric layer 15 oscillates. The driving voltage can be applied, for example, by grounding the first electrode 202 and changing the potential of the driving electrode 206. The angular velocity sensors 21a and 21b each include a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIGS. 13A and 13B). In the angular velocity sensors 21a and 21b shown in FIGS. 13A and 13B, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a or 21b in which the vibration parts 200b are oscillating, the vibration parts 200b are deflected respectively in their thickness direction (the Z direction) by Coriolis force. In the case where the respective vibration parts 200b are oscillating in the opposite direction mode, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a or 21b can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 15A:
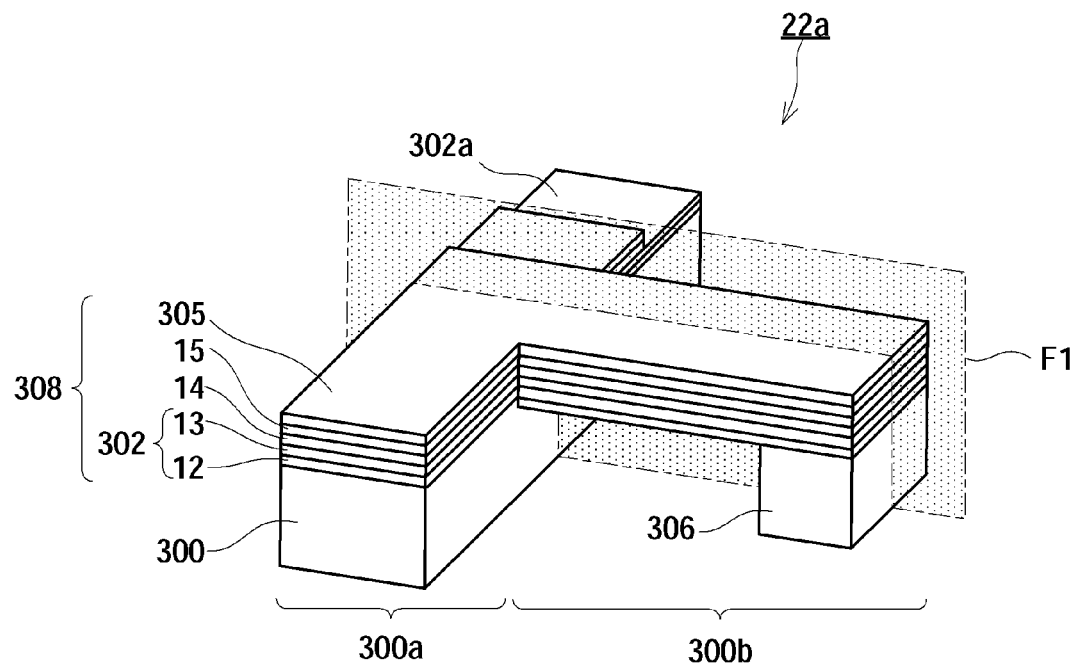
FIG. 15A is a perspective view schematically showing an example of a piezoelectric generating element of the present invention.
Figure 15B:
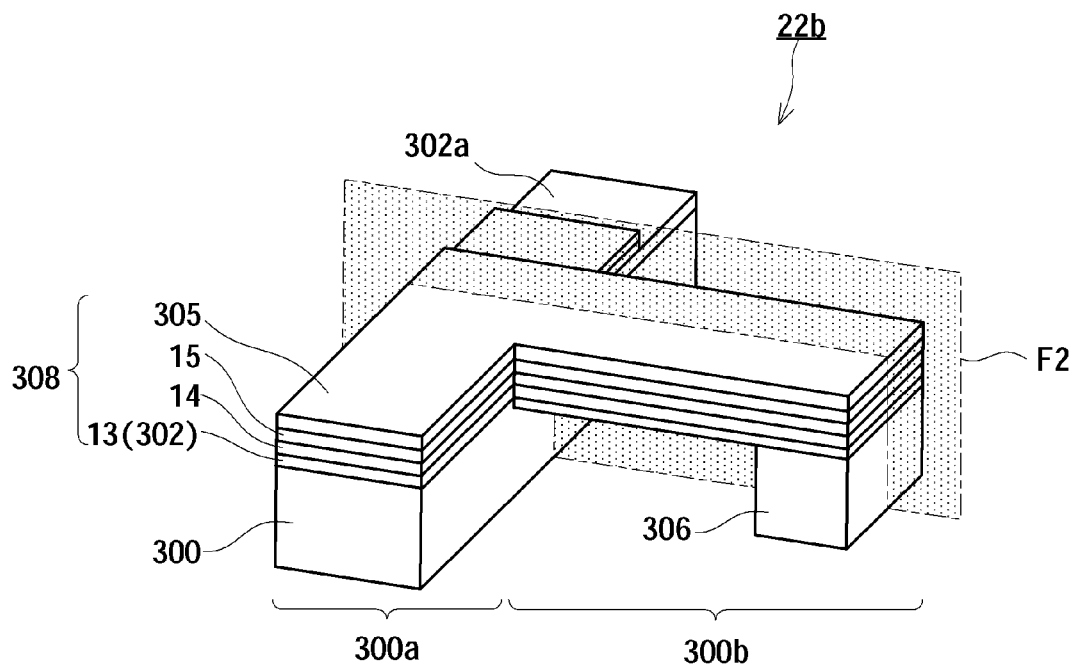
FIG. 15B is a perspective view schematically showing another example of the piezoelectric generating element of the present invention.
Figure 16A:
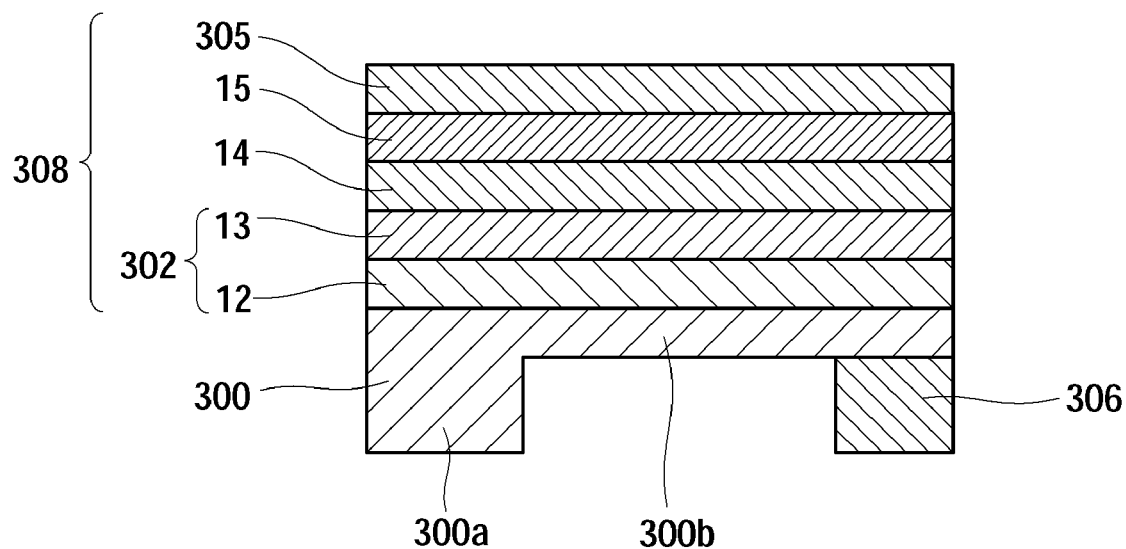
FIG. 16A is a cross-sectional view showing a cross section F1 of the piezoelectric generating element shown in FIG. 15A.
Figure 16B:
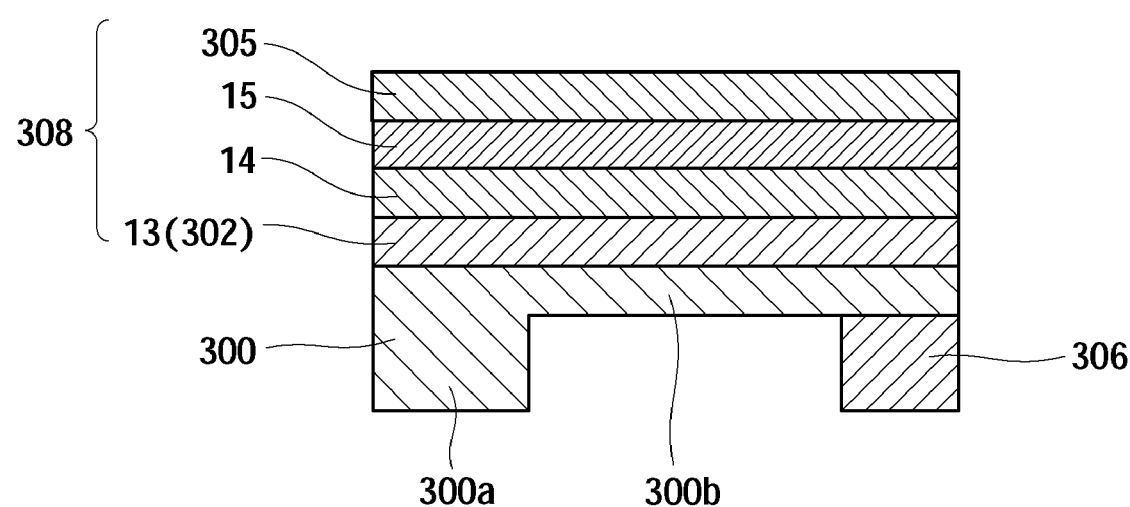
FIG. 16B is a cross-sectional view showing a cross section F2 of the piezoelectric generating element shown in FIG. 15B.

FIG. 15A, FIG. 15B, FIG. 16A, and FIG. 16B each show an example of the piezoelectric generating element of the present invention. FIG. 16A shows a cross section F1 of a piezoelectric generating element 22a shown in FIG. 15A. FIG. 16B shows a cross section F2 of a piezoelectric generating element 22b shown in FIG. 15B. The piezoelectric generating elements 22a and 22b are elements that convert externally-applied mechanical vibration into electrical energy. The piezoelectric generating elements 22a and 22b are applied suitably to a self-sustained power supply for generating electric power from various vibrations including engine vibrations and driving vibrations generated in vehicles and machines, and vibrations generated during walking.

The piezoelectric generating elements 22a and 22b shown in FIG. 15A to FIG. 16B each includes a substrate 300 having a vibration part 300b and a piezoelectric thin film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is joined to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is joined can be adjusted according to a desired resonance frequency of the vibration part 300b. The weight load may be omitted. The weight load is not necessary when the resonance frequency of the vibration part 300b is not adjusted.

The piezoelectric thin film 308 is bonded to the vibration part 300b. The piezoelectric thin film 308 includes the piezoelectric layer 15, the interface layer 14, the first electrode 302, and the second electrode 305. The piezoelectric layer 15 is sandwiched between the first electrode 302 and the second electrode 305. A piezoelectric thin film 308 has a multilayer structure in which the first electrode 302, the interface layer 14, the piezoelectric layer 15, and the second electrode 305 are laminated in this order.

In the piezoelectric thin film 308 shown in FIG. 15A and FIG. 16A, the first electrode 302 is a laminate of the metal electrode film 12 and the LaNiO$_3$ film 13. The LaNiO$_3$ film 13 is in contact with the interface layer 14. This piezoelectric thin film 308 has a multilayer structure in which the metal electrode film 12, the LaNiO$_3$ film 13, the interface layer 14, the piezoelectric layer 15, and the second electrode 305 are laminated in this order. That is, the piezoelectric thin film 308 shown in FIG. 15A and FIG. 16A has a structure in which the multilayer structure 16b shown in FIG. 1B further includes the second electrode 305.

In the piezoelectric thin film 308 shown in FIG. 15B and FIG. 16B, the first electrode 302 is the LaNiO$_3$ film 13. This piezoelectric thin film 308 has a multilayer structure in which the LaNiO$_3$ film 13, the interface layer 14, the piezoelectric layer 15, and the second electrode 305 are laminated in this order. That is, the piezoelectric thin film 308 shown in FIG. 15B and FIG. 16B has a structure in which the multilayer structure 16a shown in FIG. 1A further includes the second electrode 305.

The metal electrode film 12, the LaNiO$_3$ film 13, the interface layer 14, and the piezoelectric layer 15 in each of the piezoelectric thin films 308 shown in FIG. 15A to FIG. 16B are the same as those in the piezoelectric thin film of the present invention that has been described above, including the preferred embodiments thereof.

The second electrode 305 can be formed of, for example, a Cu electrode film. The Cu electrode is preferable for the second electrode 305 because of its excellent adhesion to the piezoelectric layer 15. The second electrode 305 can be a Pt electrode film or an Au electrode having, on its surface, an adhesive layer made of a conductive material. Since Ti has high adhesion to the piezoelectric layer 15, it can be used as a material for the adhesive layer.

In FIG. 15A to FIG. 16B, a part of the first electrode 302 is exposed. This part serves as a connection terminal 302a.

Preferably, the first electrode 302 has a thickness of at least 0.05 µm but not more than 1 µm. When the first electrode 302 is a laminate of the metal electrode film 12 and the LaNiO$_3$ film 13, it is preferable that the LaNiO$_3$ film 13 have a thickness of at least 0.05 µm but not more than 0.5 µm. It is preferable that the interface layer 14 have a thickness of at least 0.05 µm but not more than 0.5 µm. It is preferable that the piezoelectric layer 15 have a thickness of at least 0.5 µm but not more than 5 µm. It is preferable that the second electrode 305 have a thickness of at least 0.05 µm but not more than 0.5 µm.

In FIG. 15A to FIG. 16B, the first electrode 302, the interface layer 14, the piezoelectric layer 15, and the second electrode 305 are laminated in this order, when viewed from the substrate 300 having the vibration part 300b. The order of lamination of these layers may be reversed. That is, the second electrode, the piezoelectric layer, the interface layer, and the first electrode (the first electrode includes the LaNiO$_3$ film 13 that is in contact with the interface layer 14) can be laminated in this order, when viewed from the substrate having the vibration part.

In FIG. 15A to FIG. 16B, the piezoelectric thin film 308 can be bonded to both of the vibration part 300b and the stationary part 300a. The piezoelectric thin film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

The piezoelectric generating element of the present invention is manufactured, for example, by the following method using the above-mentioned piezoelectric thin film manufacturing method. The following method is used in the case where the first electrode 302 includes the metal electrode film 12. A person skilled in the art can apply the following method also to the case where the first electrode 302 does not include the metal electrode film 12.

First, the metal electrode film 12, the LaNiO$_3$ film 13, the interface layer 14, the piezoelectric layer 15, and the electrode layer are formed on the surface of a substrate (for example, a Si substrate) in this order. The above-mentioned thin film formation techniques can be employed to form the respective layers (and films).

Next, the electrode layer is patterned using a microfabrication technique to form the second electrode 305. Furthermore, the piezoelectric layer 15, the interface layer 14, the LaNiO$_3$ film 13, and the metal electrode film 12 are patterned using a microfabrication technique. The LaNiO$_3$ film 13 and the metal electrode film 12 are thus patterned to form the connection terminal 302a in parallel. Then, the substrate is patterned using the microfabrication technique to form the stationary part 300a and the vibration part 300b. The piezoelectric generating element of the present invention can be manufactured in this manner. In the case where the resonance frequency of the vibration part 300*b* needs to be adjusted, the weight load 306 is bonded to the vibration part 300*b* by a well-known method.

The microfabrication technique is, for example, dry etching.

A transfer technique using a base substrate can be applied to the manufacture of the piezoelectric generating element of the present invention. Specifically, the following method can be employed, for example. First, the metal electrode film 12, the LaNiO$_3$ film 13, the interface layer 14, the piezoelectric layer 15, and the electrode layer are formed on the surface of a base substrate in this order. Next, the laminate thus formed is bonded to another new substrate so that the substrate and the electrode layer are in contact with each other. Next, the base substrate is removed by a well-known technique. Next, the respective layers (and films) are patterned using a microfabrication technique. Thus, the piezoelectric generating element of the present invention can be manufactured. The laminate and the new substrate can be bonded together via, for example, an adhesive layer. The material for the adhesive layer is not limited as long as the laminate is bonded stably to the new substrate. More specifically, an acrylic resin adhesive, an epoxy resin adhesive, a silicone adhesive, or a polyimide adhesive can be used. In this case, it is preferable that the adhesive layer have a thickness of at least 0.2 μm but not more than 1 μm.

[Method of Generating Electric Power with Piezoelectric Generating Element]

The above-described piezoelectric generating element of the present invention is vibrated to obtain electric power through the first electrode and the second electrode.

When mechanical vibration is applied externally to the piezoelectric generating element 22*a* or 22*b*, the vibration part 300*b* starts vibrating to produce vertical deflection with respect to the stationary part 300*a*. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300*b* is close to the frequency of mechanical vibration to be applied externally to the element, the amplitude of the vibration part 300*b* increases and thus the electric power generation characteristics are improved. Therefore, the weight load 306 is preferably used to adjust the resonance frequency of the vibration part 300*b* to be close to the frequency of mechanical vibration applied externally to the element.

Examples

Hereinafter, the present invention is described in more detail with reference to an example. The present invention is not limited to the following example.

Example

In this example, a piezoelectric thin film having a structure shown in FIG. 1D was fabricated. The fabrication procedure is as follows.

A Pt electrode film (with a thickness of 100 nm) having a (111) orientation was formed by RF magnetron sputtering on the surface, having a plane orientation of (100), of a monocrystalline Si substrate. The Pt electrode film was formed using a metallic Pt target in an argon (Ar) gas atmosphere under the film formation conditions of an RF power of 15 W and a substrate temperature of 300° C. To improve the adhesion between the monocrystalline Si substrate and the Pt electrode film, a Ti film (with a thickness of 2.5 nm) was formed previously on the surface of the monocrystalline Si substrate before the Pt electrode film was formed. The Ti film was formed in the same manner as in the formation of the Pt electrode film except that a metallic Ti target was used instead of the metallic Pt target.

Next, a LaNiO$_3$ film (with a thickness of 200 nm) having a (001) orientation was formed by RF magnetron sputtering on the surface of the Pt electrode film. This LaNiO$_3$ film was formed using LaNiO$_3$ having a stoichiometric composition as a target in a mixed gas atmosphere of Ar and oxygen (with a flow ratio between Ar and O$_2$ of 80:20) under the film formation conditions of an RF power of 100 W and a substrate temperature of 300° C.

Furthermore, a (Bi$_{0.5}$Na$_{0.5}$)TiO$_3$ film (with a thickness of 200 nm) having a (001) orientation was formed as an interface layer by RF magnetron sputtering on the surface of the LaNiO$_3$ film. This interface layer was formed using (Bi$_{0.5}$Na$_{0.5}$)TiO$_3$ having a stoichiometric composition as a target in a mixed gas atmosphere of Ar and oxygen (with a flow ratio between Ar and O$_2$ of 50:50) under the film formation conditions of an RF power of 170 W and a substrate temperature of 650° C.

Next, a [(Bi$_{0.5}$Na$_{0.5}$)TiO$_3$]$_{0.93}$—[BaTiO$_3$]$_{0.07}$ film with a thickness of 2.7 μm was formed as a piezoelectric layer by RF magnetron sputtering on the surface of the (Bi$_{0.5}$Na$_{0.5}$)TiO$_3$ film. This [(Bi$_{0.5}$Na$_{0.5}$)TiO$_3$]$_{0.93}$—[BaTiO$_3$]$_{0.07}$ film was formed using [(Bi$_{0.5}$Na$_{0.5}$)TiO$_3$]$_{0.93}$—[BaTiO$_3$]$_{0.07}$ having a stoichiometric composition as a target in a mixed gas atmosphere of Ar and oxygen (with a flow ratio between Ar and O$_2$ of 50:50) under the film formation conditions of an RF power of 170 W and a substrate temperature of 650° C.

In this manner, a piezoelectric thin film, in which the monocrystalline Si substrate, the Pt electrode film having the (111) orientation, the LaNiO$_3$ film having the (001) orientation, the (Bi,Na)TiO$_3$ film having the (001) orientation, and the (Bi,Na,Ba)TiO$_3$ film having the (001) orientation were laminated in this order, was obtained.

Figure 17:
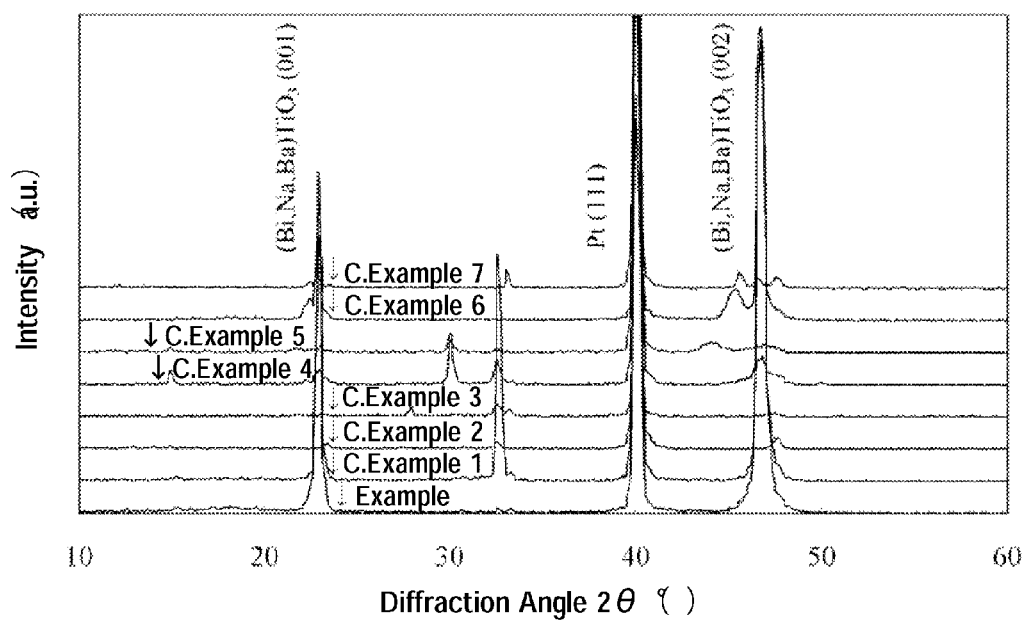
FIG. 17 is a diagram showing X-ray diffraction profiles of piezoelectric thin films fabricated in Example and Comparative Examples 1 to 7.

The [(Bi$_{0.5}$Na$_{0.5}$)TiO$_3$]$_{0.93}$—[BaTiO$_3$]$_{0.07}$ film ((Bi,Na,Ba)TiO$_3$ film) was subjected to an X-ray diffraction analysis to evaluate the crystal structure thereof. The X-ray diffraction analysis was carried out in such a manner that the (Bi,Na,Ba)TiO$_3$ film, which was laminated on the interface layer, was irradiated with an X-ray beam incident on this (Bi,Na,Ba)TiO$_3$. FIG. 17 shows the result thereof. In Comparative Examples below, X-ray diffraction analyses were carried out in the same manner.

FIG. 17 shows the obtained X-ray diffraction profile. These profile showed that only the reflection peak derived from the (001)-oriented (Bi,Na,Ba)TiO$_3$ film, except for the reflection peaks derived from the Si substrate and the Pt electrode film, was observed. The intensity of the (001) peak was 4,297 cps, which was a very high level. This means that the (Bi,Na,Ba)TiO$_3$ film has a high (001) orientation.

Subsequently, the half value width of the reflection peak derived from the (Bi,Na,Ba)TiO$_3$ film in the obtained X-ray diffraction profile was obtained by rocking curve measurement. The rocking curve measurement is a measurement in which the incident angle of the X-ray beam is scanned while the diffraction angle 2θ is fixed to the diffraction angle of the reflection peak to be measured. As a result, the obtained half value width was a very small value of 2.57°. This means that (Bi,Na,Ba)TiO$_3$ has extremely high crystallinity. In Comparative Examples below, the same method was used to measure the half value widths of the reflection peaks.

Next, an Au electrode film with a thickness of 100 μm was formed by vapor deposition on the surface of the (Bi,Na,Ba)TiO$_3$ film so as to form a piezoelectric thin film. The ferroelectric properties and piezoelectric performance of this piezoelectric thin film were evaluated using the Pt electrode film and the formed Au electrode film included in the piezoelectric thin film.

An impedance analyzer was used to measure the dielectric loss at 1 kHz. As a result, the value of tan δ of the piezoelectric thin film was 6.5%.

Figure 18:
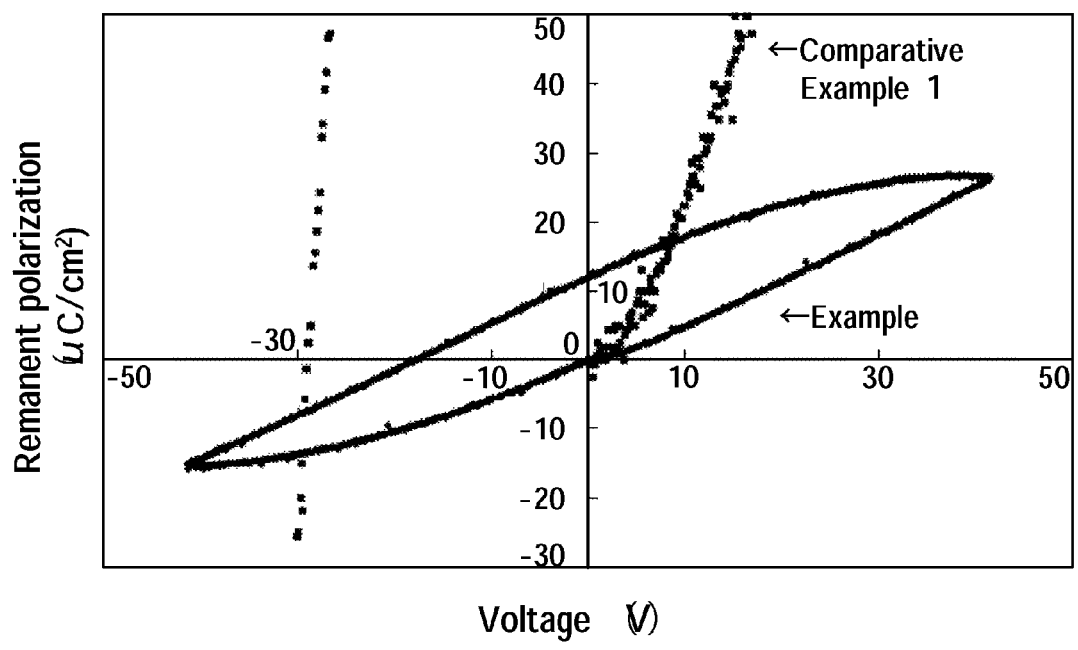
FIG. 18 is a diagram showing P-E hysteresis loops of the piezoelectric thin films fabricated in Example and Comparative Example 1.

FIG. 18 shows a P-E hysteresis loop of the piezoelectric thin film. As shown in FIG. 18, it was confirmed that the piezoelectric thin film exhibited better ferroelectric properties with an increase in the voltage applied to the piezoelectric layer through the Pt electrode film and the Au electrode film.

The piezoelectric performance of the piezoelectric thin film was evaluated in the following manner. The piezoelectric thin film was cut into a strip with a width of 2 mm (including the width of the Au electrode film) and worked into a cantilever shape. A potential difference was applied between the Pt electrode film and the Au electrode film, and the resulting displacement of the cantilever was measured with a laser displacement meter. The measured displacement was converted into a piezoelectric constant $d_{31}$ to evaluate the piezoelectric thin film. The piezoelectric constant $d_{31}$ of the piezoelectric thin film was −78 pC/N. In Comparative Examples below, the same method was used to evaluate the piezoelectric constant $d_{31}$.

Comparative Example 1

Figure 19:
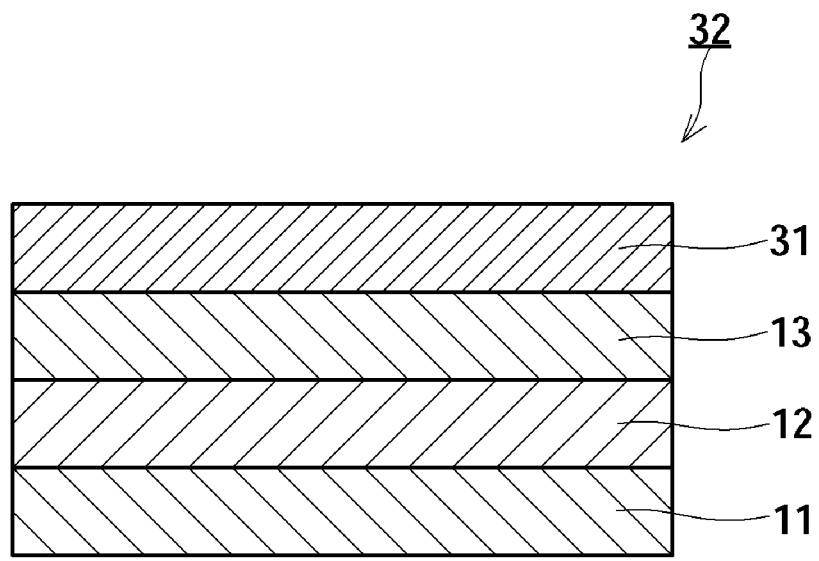
FIG. 19 is a cross-sectional view schematically showing a structure of the piezoelectric thin film fabricated in Comparative Example 1.

A piezoelectric thin film 32 as shown in FIG. 19, in which the Si substrate 11, the Pt electrode film 12, the LaNiO$_3$ film 13, and the (Bi,Na,Ba)TiO$_3$ film 31 as a piezoelectric layer were laminated in this order, was fabricated in the same manner as in Example except that a (Bi,Na)TiO$_3$ film serving as an interface layer was not formed.

FIG. 17 shows the result of the X-ray diffraction analysis of the (Bi,Na,Ba)TiO$_3$ film for the evaluation of the crystal structure thereof.

As shown in FIG. 17, the reflection peak derived from the (001)-oriented (Bi,Na,Ba)TiO$_3$ film was observed. However, a reflection peak derived from another crystal orientation (110) of the (Bi,Na,Ba)TiO$_3$ film was observed as well. The intensity of the above reflection peak in the (001) direction was 2,661 cps, which was a lower level than the peak intensity (4,297 cps) in Example. This means that the (Bi,Na,Ba)TiO$_3$ film in Comparative Example 1 has a lower degree of orientation than the (Bi,Na,Ba)TiO$_3$ film in Example.

The half value width of the above reflection peak in the (001) direction was 2.89°, which was greater than the width (of 2.57°) in Example. This means that the (Bi,Na,Ba)TiO$_3$ film in Comparative Example 1 has a lower degree of crystallinity than the (Bi,Na,Ba)TiO$_3$ film in Example.

Next, an Au electrode film with a thickness of 100 μm was formed by vapor deposition on the surface of the (Bi,Na,Ba)TiO$_3$ film so as to obtain a piezoelectric thin film. An attempt was made to evaluate the ferroelectric properties and piezoelectric performance of this piezoelectric thin film using the Pt electrode film and the formed Au electrode film included in the piezoelectric thin film. However, a very large leak current in the piezoelectric thin film made it difficult to obtain a P-E hysteresis loop (see FIG. 18). An impedance analyzer was used to measure the dielectric loss at 1 kHz. As a result, the value of tan δ of the piezoelectric thin film was 40%. The leak current made it difficult to obtain the accurate value of the piezoelectric constant $d_{31}$. Presumably, the piezoelectric constant $d_{31}$ thereof was about −40 pC/N.

Comparative Examples 2 to 7

Figure 20:
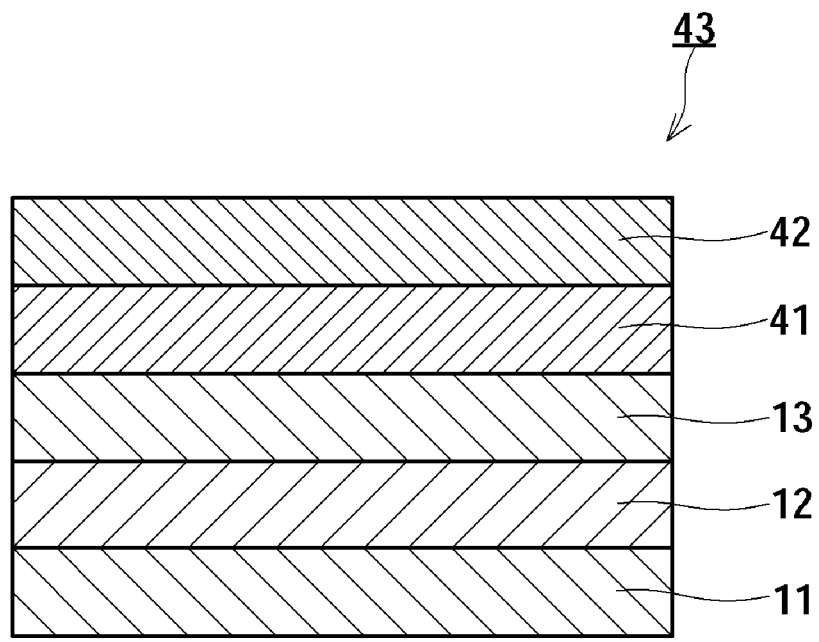
FIG. 20 is a cross-sectional view schematically showing a structure of the piezoelectric thin films fabricated in Comparative Examples 2 to 7.

In each of Comparative Examples 2 to 7, a piezoelectric thin film 43 as shown in FIG. 20, in which the Si substrate 11, the Pt electrode film 12, the LaNiO$_3$ film 13, the interface layer 41, and the (Bi,Na,Ba)TiO$_3$ film 42 as a piezoelectric layer were laminated in this order, was fabricated in the same manner as in Example except that the composition of the interface layer was different.

Comparative Example 2

A piezoelectric thin film was fabricated in the same manner as in Example except that a titanium oxide (TiO$_2$) film was formed as an interface layer on the surface of a LaNiO$_3$ film and a (Bi,Na,Ba)TiO$_3$ film was formed as a piezoelectric layer on the surface of this TiO$_2$ film. This TiO$_2$ film was formed by RF magnetron sputtering using TiO$_2$ as a target in a mixed gas atmosphere of Ar and oxygen (with a flow ratio between Ar and O$_2$ of 50:50) under the film formation conditions of an RF power of 170 W and a substrate temperature of 650° C. The TiO$_2$ film had a thickness of 200 nm.

FIG. 17 shows the result of the X-ray diffraction analysis of the (Bi,Na,Ba)TiO$_3$ film for the evaluation of the crystal structure thereof.

As shown in FIG. 17, the intensity of the reflection peak derived from the (001)-oriented (Bi,Na,Ba)TiO$_3$ film was 80 cps, which was a very low level. No reflection peaks derived from the other crystal phases of the (Bi,Na,Ba)TiO$_3$ film were observed. Presumably, in Comparative Example 2, the (Bi,Na,Ba)TiO$_3$ film was in the randomly-oriented crystalline state, in which crystal orientation in a specific direction was rarely observed.

In Comparative Example 2, neither the evaluation of the crystallinity by rocking curve measurement nor the evaluation of the ferroelectric properties and piezoelectric performance were performed because the (Bi,Na,Ba)TiO$_3$ film in Comparative Example 2 has a lower degree of orientation than the (Bi,Na,Ba)TiO$_3$ film in Comparative Example 1.

Comparative Example 3

A piezoelectric thin film was fabricated in the same manner as in Example except that a bismuth titanate (Bi$_4$Ti$_3$O$_{12}$) film was formed as an interface layer on the surface of a LaNiO$_3$ film and a (Bi,Na,Ba)TiO$_3$ film was formed as a piezoelectric layer on the surface of the Bi$_4$Ti$_3$O$_{12}$ film. This Bi$_4$Ti$_3$O$_{12}$ film was formed by RF magnetron sputtering using Bi$_4$Ti$_3$O$_{12}$ as a target in a mixed gas atmosphere of Ar and oxygen (with a flow ratio between Ar and O$_2$ of 50:50) under the film formation conditions of an RF power of 170 W and a substrate temperature of 650° C. The Bi$_4$Ti$_3$O$_{12}$ film had a thickness of 200 nm.

FIG. 17 shows the result of the X-ray diffraction analysis of the (Bi,Na,Ba)TiO$_3$ film for the evaluation of the crystal structure thereof.

As shown in FIG. 17, the intensity of the reflection peak derived from the (001)-oriented (Bi,Na,Ba)TiO$_3$ film was 41 cps, which was a very low level. No reflection peaks derived from the other crystal phases of the (Bi,Na,Ba)TiO$_3$ film were observed. Presumably, in Comparative Example 3, the (Bi, Na,Ba)TiO$_3$ film was in the randomly-oriented crystalline state, in which crystal orientation in a specific direction was rarely observed.

In Comparative Example 3, neither the evaluation of the crystallinity by rocking curve measurement nor the evaluation of the ferroelectric properties and piezoelectric performance were performed because the (Bi,Na,Ba)TiO$_3$ film in Comparative Example 3 has a lower degree of orientation than the (Bi,Na,Ba)TiO$_3$ film in Comparative Example 1.

Comparative Example 4

A piezoelectric thin film was fabricated in the same manner as in Example except that a sodium titanate (Na$_2$TiO$_3$) film was formed as an interface layer on the surface of a LaNiO$_3$ film and a (Bi,Na,Ba)TiO$_3$ film was formed as a piezoelectric layer on the surface of the Na$_2$TiO$_3$ film. This Na$_2$TiO$_3$ film was formed by RF magnetron sputtering using Na$_2$TiO$_3$ as a target in a mixed gas atmosphere of Ar and oxygen (with a flow ratio between Ar and O$_2$ of 50:50) under the film formation conditions of an RF power of 170 W and a substrate temperature of 650° C. The Na$_2$TiO$_3$ film had a thickness of 200 nm.

FIG. 17 shows the result of the X-ray diffraction analysis of the (Bi,Na,Ba)TiO$_3$ film for the evaluation of the crystal structure thereof.

As shown in FIG. 17, the intensity of the reflection peak derived from the (001)-oriented (Bi,Na,Ba)TiO$_3$ film was 191 cps, which was a very low level. No reflection peaks derived from the other crystal phases of the (Bi,Na,Ba)TiO$_3$ film were observed. Presumably, in Comparative Example 4, the (Bi,Na,Ba)TiO$_3$ film was in the randomly-oriented crystalline state, in which crystal orientation in a specific direction was rarely observed.

In Comparative Example 4, neither the evaluation of the crystallinity by rocking curve measurement nor the evaluation of the ferroelectric properties and piezoelectric performance were performed because the (Bi,Na,Ba)TiO$_3$ film in Comparative Example 4 has a lower degree of orientation than the (Bi,Na,Ba)TiO$_3$ film in Comparative Example 1.

Comparative Example 5

A piezoelectric thin film was fabricated in the same manner as in Example except that a barium titanate (BaTiO$_3$) film was formed as an interface layer on the surface of a LaNiO$_3$ film and a (Bi,Na,Ba)TiO$_3$ film was formed as a piezoelectric layer on the surface of the BaTiO$_3$ film. This BaTiO$_3$ film was formed by RF magnetron sputtering using BaTiO$_3$ as a target in a mixed gas atmosphere of Ar and oxygen (with a flow ratio between Ar and O$_2$ of 50:50) under the film formation conditions of an RF power of 170 W and a substrate temperature of 650° C. The BaTiO$_3$ film had a thickness of 200 nm.

FIG. 17 shows the result of the X-ray diffraction analysis of the (Bi,Na,Ba)TiO film for the evaluation of the crystal structure thereof.

As shown in FIG. 17, the intensity of the reflection peak derived from the (001)-oriented (Bi,Na,Ba)TiO$_3$ film was 81 cps, which was a very low level. No reflection peaks derived from the other crystal phases of the (Bi,Na,Ba)TiO$_3$ film were observed. Presumably, in Comparative Example 5, the (Bi,Na,Ba)TiO$_3$ film was in the randomly-oriented crystalline state, in which crystal orientation in a specific direction was rarely observed.

In Comparative Example 5, neither the evaluation of the crystallinity by rocking curve measurement nor the evaluation of the ferroelectric properties and piezoelectric performance were performed because the (Bi,Na,Ba)TiO$_3$ film in Comparative Example 5 has a lower degree of orientation than the (Bi,Na,Ba)TiO$_3$ film in Comparative Example 1.

Comparative Example 6

A piezoelectric thin film was fabricated in the same manner as in Example except that a barium-bismuth titanate (Bi$_4$Ti$_3$O$_{12}$—BaTiO$_3$) film was formed as an interface layer on the surface of a LaNiO$_3$ film and a (Bi,Na,Ba)TiO$_3$ film was formed as a piezoelectric layer on the surface of the Bi$_4$Ti$_3$O$_{12}$—BaTiO$_3$ film. This Bi$_4$Ti$_3$O$_{12}$—BaTiO$_3$ film was formed by RF magnetron sputtering using Bi$_4$Ti$_3$O$_{12}$—BaTiO$_3$ synthesized from bismuth titanate (Bi$_4$Ti$_3$O$_{12}$) and barium titanate (BaTiO$_3$), as a target, in a mixed gas atmosphere of Ar and oxygen (with a flow ratio between Ar and O$_2$ of 50:50) under the film formation conditions of an RF power of 170 W and a substrate temperature of 650° C. The Bi$_4$Ti$_3$O$_{12}$—BaTiO$_3$ film had a thickness of 200 nm.

FIG. 17 shows the result of the X-ray diffraction analysis of the (Bi,Na,Ba)TiO$_3$ film for the evaluation of the crystal structure thereof.

As shown in FIG. 17, the intensity of the reflection peak derived from the (001)-oriented (Bi,Na,Ba)TiO$_3$ film was 1,470 cps, which was a very low level. No reflection peaks derived from the other crystal phases of the (Bi,Na,Ba)TiO$_3$ film were observed. Presumably, in Comparative Example 6, the (Bi,Na,Ba)TiO$_3$ film was in the randomly-oriented crystalline state, in which crystal orientation in a specific direction was rarely observed.

In Comparative Example 6, neither the evaluation of the crystallinity by rocking curve measurement nor the evaluation of the ferroelectric properties and piezoelectric performance were performed because the (Bi,Na,Ba)TiO$_3$ film in Comparative Example 6 has a lower degree of orientation than the (Bi,Na,Ba)TiO$_3$ film in Comparative Example 1.

Comparative Example 7

A piezoelectric thin film was fabricated in the same manner as in Example except that a sodium-barium titanate (Na$_2$TiO$_3$—BaTiO$_3$) film was formed as an interface layer on the surface of a LaNiO$_3$ film and a (Bi,Na,Ba)TiO$_3$ film was formed as a piezoelectric layer on the surface of the Na$_2$TiO$_3$—BaTiO$_3$ film. This Na$_2$TiO$_3$—BaTiO$_3$ film was formed by RF magnetron sputtering using Na$_2$TiO$_3$—BaTiO$_3$ synthesized from sodium titanate (Na$_2$TiO$_3$) and barium titanate (BaTiO$_3$), as a target, in a mixed gas atmosphere of Ar and oxygen (with a flow ratio between Ar and O$_2$ of 50:50) under the film formation conditions of an RF power of 170 W and a substrate temperature of 650° C. The Na$_2$TiO$_3$—BaTiO$_3$ film had a thickness of 200 nm.

FIG. 17 shows the result of the X-ray diffraction analysis of the (Bi,Na,Ba)TiO$_3$ film for the evaluation of the crystal structure thereof.

As shown in FIG. 17, the intensity of the reflection peak derived from the (001)-oriented (Bi,Na,Ba)TiO$_3$ film was 133 cps, which was a very low level. No reflection peaks derived from the other crystal phases of the (Bi,Na,Ba)TiO$_3$ film were observed. Presumably, in Comparative Example 7, the (Bi,Na,Ba)TiO$_3$ film was in the randomly-oriented crystalline state, in which crystal orientation in a specific direction was rarely observed.

In Comparative Example 7, neither the evaluation of the crystallinity by rocking curve measurement nor the evaluation of the ferroelectric properties and piezoelectric performance were performed because the (Bi,Na,Ba)TiO$_3$ film in Comparative Example 7 has a lower degree of orientation than the (Bi,Na,Ba)TiO$_3$ film in Comparative Example 1.

Table 1 below summarizes the evaluation results of Example and Comparative Examples 1 to 7.

TABLE 1

| | Composition of interface layer | (001) orientation and crystallinity of (Bi,Na,Ba)TiO$_3$ film | | Piezo electric constant d$_{31}$ (pC/N) | Dielectric loss (%) |
| | | Peak intensity (cps) | Half value width(°) | | |
|---|---|---|---|---|---|
| Example | (Bi,Na)TiO$_3$ | 4,297 | 2.57 | −78 | 6.5 |
| Com. Example 1 | None (interface layer is not included) | 2,661 | 2.89 | −40 | 40 |
| Com. Example 2 | TiO$_2$ | 80 | — | — | — |
| Com. Example 3 | Bi$_4$Ti$_3$O$_{12}$ | 41 | — | — | — |
| Com. Example 4 | Na$_2$TiO$_3$ | 191 | — | — | — |
| Com. Example 5 | BaTiO$_3$ | 81 | — | — | — |
| Com. Example 6 | Bi$_4$Ti$_3$O$_{12}$—BaTiO$_3$ | 1,470 | — | — | — |
| Com. Example 7 | Na$_2$TiO$_3$—BaTiO$_3$ | 133 | — | — | — |

As shown in Table 1, a piezoelectric layer composed of a (Bi,Na,Ba)TiO$_3$ film having high (001) orientation and high crystallinity was formed only when a (Bi,Na)TiO$_3$ film was formed as an interface layer. In the case where a film other than a (Bi,Na)TiO$_3$ film was formed as an interface layer as in Comparative Examples 2 to 7, the crystallinity and orientation of the (Bi,Na,Ba)TiO$_3$ film deteriorated rather than the case where an interface layer was not included as in Comparative Example 1. That is, it was confirmed that the provision of an interface layer containing a part of the constituent metal elements of a piezoelectric layer cannot necessarily improve the crystallinity and orientation of the piezoelectric layer.

It was difficult to evaluate accurately the ferroelectric properties of the obtained piezoelectric thin film having no interface layer (Comparative Example 1) due to a very large leak current therein. Presumably, the piezoelectric constant d$_{31}$ thereof was about −40 pC/N. The ferroelectric properties of the piezoelectric layers in Comparative Examples 2 to 7 were not evaluated because the degrees of their orientation and crystallinity were even lower than those in Comparative Example 1. It is believed, however, that the ferroelectric properties of the piezoelectric layers in Comparative Examples 2 to 7 were even lower than those in Comparative Example 1. In contrast, in Example, a good ferroelectric hysteresis loop was obtained because of a very small leak current.

JP 2007-266346 A discloses a piezoelectric layer composed of a (Bi,Na,Ba)TiO$_3$ film. JP 10(1998)-182291 A describes in paragraph 0020 as follows: "It is more preferable to form an oxide layer as a buffer layer between the ferroelectric thin film and the substrate. Oxides usable for the buffer layer preferably contain all or a part of the elements constituting the ferroelectric thin film that is formed thereon". From this description, it is presumed that metal oxides containing one, or two or more metal elements selected from Bi, Na, Ba, and Ti are preferably used as a buffer layer to form the (Bi,Na,Ba)TiO$_3$ film.

As shown in Example, however, in the case where one of these oxides containing one of the metal elements (TiO$_2$ in Comparative Example 2) is used as a buffer layer, the resulting (Bi,Na,Ba)TiO$_3$ film has a very low degree of crystal orientation. Even if an oxide containing two of the metal elements (Comparative Examples 3 to 5) is used as a buffer layer, the resulting (Bi,Na,Ba)TiO$_3$ film has a very low degree of crystal orientation. Even if an oxide containing three of the metal elements is used as a buffer layer, when the combination of the metal elements is a combination of Bi, Ba, and Ti (Comparative Example 6), or a combination of Na, Ba, and Ti (Comparative Example 7), the resulting (Bi,Na,Ba)TiO$_3$ film has a low (or a very low) degree of crystal orientation. In fact, the piezoelectric layers in Comparative Examples 2 to 7 have lower degrees of crystal orientation than the piezoelectric layer in Comparative Example 1 in which an interface layer is not included.

Only in the case where a combination of Bi, Na, and Ti (Example) is used as a buffer layer, a (Bi,Na, Ba)TiO$_3$ film having extremely high crystallinity and orientation can be obtained.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

Industrial Applicability

The (Bi,Na,Ba)TiO$_3$ piezoelectric layer of the piezoelectric thin film of the present invention has high (001) orientation and high crystallinity, and therefore the piezoelectric thin film has high ferroelectric properties and high piezoelectric performance. The piezoelectric thin film of the present invention is useful as a piezoelectric thin film alternative to existing lead-containing oxide ferroelectrics. The piezoelectric thin film of the present invention can be used suitably for applications such as pyroelectric sensors and piezoelectric devices in which piezoelectric thin films are used. Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image with this ink jet head has high image forming accuracy and high expressivity. The angular velocity sensor of the present invention has high sensitivity although it does not contain a lead-containing ferroelectric material such as PZT. The method of measuring an angular velocity with this angular velocity sensor has excellent measurement sensitivity. The piezoelectric generating element of the present invention has excellent electric power generation characteristics although it does not contain a lead-containing ferroelectric material such as PZT. The electric power generation method of the present invention with this piezoelectric generating element has high electric power generation efficiency. The ink jet head, angular velocity sensor and piezoelectric generating element, and the image forming method, angular velocity measurement method and electric power generation method according to the present invention can be widely applied to various fields and uses.

What is claimed is:

1. A piezoelectric thin film comprising:
a LaNiO$_3$ film having a (001) orientation;
an interface layer having a (001) orientation and composed of a compound represented by a chemical formula ABO$_3$ (where A is represented by (Bi,Na)$_{1-x}$C$_x$ (0≦x<1), B is Ti or TiZr, and C is an alkali metal other than Na); and
a (Bi,Na,Ba)TiO$_3$ film having a (001) orientation,
wherein the LaNiO$_3$ film, the interface layer, and the (Bi,Na,Ba)TiO$_3$ film are laminated in this order.

2. The piezoelectric thin film according to claim 1, wherein x is equal to 0, and B is Ti.

3. The piezoelectric thin film according to claim 1, further comprising a metal electrode film,
wherein the LaNiO$_3$ film is formed on the metal electrode film.

4. The piezoelectric thin film according to claim 3, wherein the metal electrode film is made of Pt.

5. The piezoelectric thin film according to claim 1, further comprising a substrate,
wherein the LaNiO$_3$ film is formed on the substrate.

6. The piezoelectric thin film according to claim 5, wherein the substrate is made of Si.

7. A method of manufacturing a piezoelectric thin film, comprising:
forming a LaNiO$_3$ film having a (001) orientation by sputtering;
forming an interface layer on the LaNiO$_3$ film by sputtering, the interface layer having a (001) orientation and being composed of a compound represented by a chemical formula ABO$_3$ (where A is represented by (Bi,Na)$_{1-x}$C$_x$ (0≦x<1), B is Ti or TiZr, and C is an alkali metal other than Na); and
forming a (Bi,Na,Ba)TiO$_3$ film having a (001) orientation on the interface layer by sputtering to obtain a piezoelectric thin film in which the LaNiO$_3$ film, the interface layer, and the (Bi,Na,Ba)TiO$_3$ film are laminated in this order.

8. The method according to claim 7, wherein x is equal to 0, and B is Ti.

9. The method according to claim 7, wherein the LaNiO$_3$ film is formed on the metal electrode film.

10. The method according to claim 9, wherein the metal electrode film is made of Pt.

11. The method according to claim 7, wherein the LaNiO$_3$ film is formed on the substrate.

12. The method according to claim 11, wherein the substrate is made of Si.

13. An ink jet head comprising:
a piezoelectric thin film having a piezoelectric layer sandwiched between a first electrode and a second electrode;
a vibration layer bonded to the piezoelectric thin film; and
a pressure chamber member having a pressure chamber for storing ink and bonded to a surface of the vibration layer opposite to a surface to which the piezoelectric thin film is bonded,
wherein the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is represented by (Bi,Na)$_{1-x}$C$_x$ (0≦x<1), B is Ti or TiZr, and C is an alkali metal other than Na), and
the LaNiO$_3$ film, the interface layer, the (Bi,Na,Ba)TiO$_3$ film, and the second electrode are laminated in this order.

14. The ink jet head according to claim 13, wherein x is equal to 0, and B is Ti.

15. The ink jet head according to claim 13, wherein
the piezoelectric thin film further comprises a metal electrode film, and
the LaNiO$_3$ film is formed on the metal electrode film.

16. The ink jet head according to claim 15, wherein the metal electrode film is made of Pt.

17. A method of forming an image with an ink jet head, comprising:
preparing the ink jet head, wherein
the ink jet head comprises: a piezoelectric thin film having a piezoelectric layer sandwiched between a first electrode and a second electrode; a vibration layer bonded to the piezoelectric thin film; and a pressure chamber member having a pressure chamber for storing ink and bonded to a surface of the vibration layer opposite to a surface to which the piezoelectric thin film is bonded,
the vibration layer is bonded to the piezoelectric thin film so that the vibration layer is displaceable in its film thickness direction according to a deformation of the piezoelectric thin film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is represented by (Bi,Na)$_{1-x}$C$_x$ (0≦x<1), B is Ti or TiZr, and C is an alkali metal other than Na), and
the LaNiO$_3$ film, the interface layer, the (Bi,Na,Ba)TiO$_3$ film, and the second electrode are laminated in this order; and
applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

18. The method according to claim 17, wherein x is equal to 0, and B is Ti.

19. The method according to claim 17, wherein
the piezoelectric thin film further comprises a metal electrode film, and
the LaNiO$_3$ film is formed on the metal electrode film.

20. The method according to claim 19, wherein the metal electrode film is made of Pt.

21. An angular velocity sensor comprising:
a substrate having a vibration part; and
a piezoelectric thin film bonded to the vibration part and having a piezoelectric layer sandwiched between a first electrode and a second electrode,
wherein the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leqq x < 1$), B is Ti or TiZr, and C is an alkali metal other than Na),
the LaNiO$_3$ film, the interface layer, the (Bi,Na,Ba)TiO$_3$ film, and the second electrode are laminated in this order, and
one of the first electrode and the second electrode selected therefrom is composed of an electrode group comprising a drive electrode for applying a driving voltage that oscillates the vibration part to the piezoelectric layer and a sense electrode for measuring a deformation of the vibration part caused by an angular velocity applied to the vibration part that is oscillating.

22. The angular velocity sensor according to claim 21, wherein x is equal to 0, and B is Ti.

23. The angular velocity sensor according to claim 21, wherein
the piezoelectric thin film further comprises a metal electrode film, and
the LaNiO$_3$ film is formed on the metal electrode film.

24. The angular velocity sensor according to claim 23, wherein the metal electrode film is made of Pt.

25. A method of measuring an angular velocity with an angular velocity sensor, comprising:
preparing the angular velocity sensor, wherein
the angular velocity sensor comprises; a substrate having a vibration part; and a piezoelectric thin film bonded to the vibration part and having a piezoelectric layer sandwiched between a first electrode and a second electrode,
the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leqq x < 1$), B is Ti or TiZr, and C is an alkali metal other than Na),
the LaNiO$_3$ film, the interface layer, the (Bi,Na,Ba)TiO$_3$ film, and the second electrode are laminated in this order, and
one of the first electrode and the second electrode selected therefrom is composed of an electrode group comprising a drive electrode and a sense electrode;
applying a driving voltage to the piezoelectric layer through the drive electrode and the other of the first electrode and the second electrode selected therefrom to oscillate the vibration part; and
measuring, through the other electrode and the sense electrode, a deformation of the vibration part caused by an angular velocity applied to the vibration part that is oscillating, to obtain a value of the applied angular velocity.

26. The method according to claim 25, wherein x is equal to 0, and B is Ti.

27. The method according to claim 25, wherein
the piezoelectric thin film further comprises a metal electrode film, and
the LaNiO$_3$ film is formed on the metal electrode film.

28. The method according to claim 27, wherein the metal electrode film is made of Pt.

29. A piezoelectric generating element comprising:
a substrate having a vibration part; and
a piezoelectric thin film bonded to the vibration part and having a piezoelectric layer sandwiched between a first electrode and a second electrode,
wherein the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leqq x < 1$), B is Ti or TiZr, and C is an alkali metal other than Na), and
the LaNiO$_3$ film, the interface layer, the (Bi,Na,Ba)TiO$_3$ film, and the second electrode are laminated in this order.

30. The piezoelectric generating element according to claim 29, wherein x is equal to 0, and B is Ti.

31. The piezoelectric generating element according to claim 29, wherein
the piezoelectric thin film further comprises a metal electrode film, and
the LaNiO$_3$ film is formed on the metal electrode film.

32. The piezoelectric generating element according to claim 31, wherein the metal electrode film is made of Pt.

33. A method of generating electric power with a piezoelectric generating element, comprising:
preparing the piezoelectric generating element, wherein
the piezoelectric generating element comprises: a substrate having a vibration part; and a piezoelectric thin film bonded to the vibration part and having a piezoelectric layer sandwiched between a first electrode and a second electrode,
the first electrode comprises a LaNiO$_3$ film having a (001) orientation,
the piezoelectric layer is composed of a (Bi,Na,Ba)TiO$_3$ film having a (001) orientation,
the first electrode and the piezoelectric layer sandwich therebetween an interface layer having a (001) orientation and composed of a compound represented by a chemical formula ABO$_3$ (where A is (Bi,Na)$_{1-x}$C$_x$ ($0 \leqq x < 1$), B is Ti or TiZr, and C is an alkali metal other than Na), and the LaNiO$_3$ film, the interface layer, the (Bi,Na,Ba)TiO$_3$ film, and the second electrode are laminated in this order; and vibrating the vibration part to obtain electric power through the first electrode and the second electrode.

34. The method according to claim 33, wherein x is equal to 0, and B is Ti.

35. The method according to claim 33, wherein
the piezoelectric thin film further comprises a metal electrode film, and
the LaNiO$_3$ film is formed on the metal electrode film.

36. The method according to claim 35, wherein the metal electrode film is made of Pt.

* * * * *